United States Patent
Srinivasan

(10) Patent No.: US 9,478,305 B1
(45) Date of Patent: Oct. 25, 2016

(54) METHODS AND APPARATUS TO PROGRAM MULTI-LEVEL CELL MEMORY USING TARGET-ONLY VERIFY

(71) Applicant: Intel Corporation, Santa Clara, CA (US)

(72) Inventor: Dheeraj Srinivasan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/851,479

(22) Filed: Sep. 11, 2015

(51) Int. Cl.
*G11C 16/04* (2006.01)
*G11C 16/34* (2006.01)
*G11C 11/56* (2006.01)
*G11C 16/24* (2006.01)
*G11C 16/26* (2006.01)

(52) U.S. Cl.
CPC ....... *G11C 16/3459* (2013.01); *G11C 11/5628* (2013.01); *G11C 11/5642* (2013.01); *G11C 16/24* (2013.01); *G11C 16/26* (2013.01); *G11C 16/0483* (2013.01)

(58) Field of Classification Search
CPC .......... G11C 16/0486; G11C 16/3459; G11C 16/24; G11C 16/26; G11C 11/5628
USPC ............ 365/185.03, 185.18, 185.19, 182.22, 365/185.25
See application file for complete search history.

(56) References Cited

U.S. PATENT DOCUMENTS

| | | | |
|---|---|---|---|
| 8,391,061 B2 | 3/2013 | Elmhurst et al. | |
| 8,411,508 B2 * | 4/2013 | Kalavade | G11C 11/5628 365/185.03 |
| 9,293,195 B2 * | 3/2016 | Mui | G11C 16/26 |
| 9,349,468 B2 * | 5/2016 | Louie | G11C 16/26 |
| 2011/0080789 A1 | 4/2011 | Kalavade et al. | |
| 2016/0117216 A1 * | 4/2016 | Muchherla | G06F 11/0793 714/6.11 |

OTHER PUBLICATIONS

Yu Cai, Erich F. Haratsch, Onur Mutlu, Ken Mai, "Threshold Voltage Distribution in MLC NAND Flash Memory: Characterization, Analysis and Modeling," Proceedings of the Conference on Design, Automation & Test in Europe, (2013), ISBN: 978-1-4503-2153-2, 6 pages.

* cited by examiner

*Primary Examiner* — Gene Auduong
(74) *Attorney, Agent, or Firm* — Hanley, Flight & Zimmerman, LLC

(57) ABSTRACT

A disclosed example includes selectively precharging first bitlines of first multi-level cell (MLC) memory cells of a wordline without precharging second bitlines of second MLC memory cells of the wordline during a program verify. First strobe state outputs of the first MLC memory cells are obtained based on first sensed threshold voltage levels of the first MLC memory cells sensed at a first time. Second strobe state outputs of the first MLC memory cells are obtained based on second sensed threshold voltage levels of the first MLC memory cells sensed at a second time. Based on the first and second strobe state outputs, a first MLC memory cell of the first MLC memory cells is programmed using a first programming pulse, and a second MLC memory cell of the first MLC memory cells is programmed using a second programming pulse having a relatively higher voltage than the first programming pulse.

25 Claims, 10 Drawing Sheets

TARGET CELL B (TC$_B$) SENSING

METHODS AND APPARATUS TO PROGRAM MULTI-LEVEL CELL MEMORY USING TARGET-ONLY VERIFY

FIELD OF THE DISCLOSURE

The present disclosure relates generally to memory devices and, more particularly, to methods and apparatus to program multi-level cell memory using target-only verify.

BACKGROUND

Nonvolatile memory devices are capable of persisting data for extended periods of time without needing to be powered to maintain such data storage. Example nonvolatile memory devices include optical memory devices, magnetic memory devices, and solid state memory devices. Information is written to an optical memory device such as a compact disc (CD) or a digital versatile disk (DVD) by forming pits and landings on an optical medium representing binary bits that can be read by shining a laser on the surface of the optical memory device. Information is written to a magnetic memory device such as a hard disk drive (HDD) by changing magnetizations of different regions of a platter (disk) surface to represent different binary bits that can be read by using a read head to sense changes in the magnetizations between the different regions. Information is written to a solid state memory device such as a flash memory device by changing the electrical characteristics of transistor-based memory cells to change how such memory cells react to applied voltages. The electrical characteristics of different memory cells in a solid state memory device are representative of binary bits that can be read by sensing output voltages of the memory cells in response to applied input voltages.

When writing to nonvolatile memory devices, verification techniques are often used to ensure that information has been correctly written. For example, verification techniques can be used during a write process to read recently written information and determine whether the correct information is actually being persisted as intended. In this manner, when a write verify confirms that an instance of information is not correctly persisted, one or more further attempts can be made to write that information. Using such verification techniques increases the likelihood that the correct information is persisted in a nonvolatile memory device following a write process so that such information can be persisted over time.

DETAILED DESCRIPTION

Figure 1:
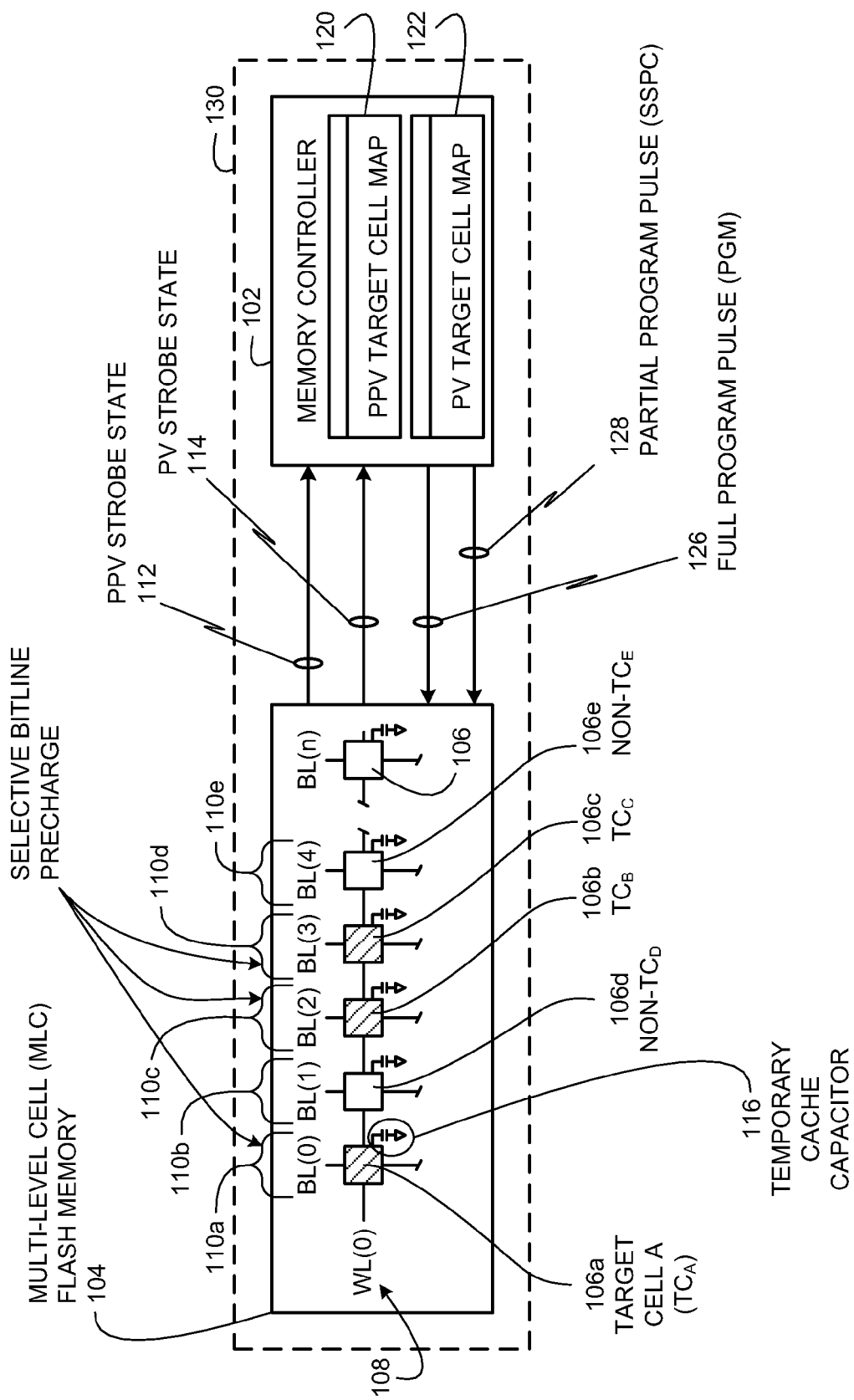
FIG. 1 is an example memory controller to perform program verify operations on an example multi-level cell (MLC) flash memory to confirm that memory cells of the MLC flash memory persist intended data.

Examples disclosed herein may be used with nonvolatile multi-level cell (MLC) flash memory devices to perform program verify operations to confirm that memory cells of the MLC flash memory persist intended data. MLC flash memory devices store multiple binary bits per memory cell. For example, to store data in a MLC memory cell, the electrical characteristics of the memory cell are changed during a programming operation to output a particular voltage level when an input voltage is applied. For example, in a two bits-per-cell (2bpc) MLC memory cell (e.g., b1, b0), the electrical characteristics of the MLC memory cell are configurable or programmable to output four distinct threshold voltage levels such as a threshold voltage level 0 (L0), a threshold voltage level 1 (L1), a threshold voltage level 2 (L2), and a threshold voltage level 3 (L3). In this manner, the four threshold voltage levels, L0-L3, are used to represent four different combinations of two binary bits (e.g., L0: b1=0, b0=0; L1: b1=0, b0=1; L2: b1=1, b0=0; L3: b1=1, b0=1). Similarly, in a 3bpc MLC memory cell (e.g., b2, b1, b0), the electrical characteristics of the MLC memory cell are configurable or programmable to output eight distinct threshold voltage levels, L0-L7, to represent eight different combinations of three binary bits (e.g., L0: 000; L1: 001; L2: 010; L3: 011; L4: 100; L5: 101; L6: 110; L7: 111).

In MLC flash memory devices, when the memory cells are programmed to store corresponding information, the threshold voltage levels of the memory cells form a threshold voltage distribution that represents the number of MLC memory cells programmed for each threshold voltage level. For example, program pulses (e.g., charges) are applied to MLC memory cells during memory cell programming passes to change their electrical characteristics and, thus, their corresponding threshold voltage levels. In some examples, multiple memory cell programming passes are used to program a memory cell to an intended threshold voltage level. That is, a single memory cell programming pass may not sufficiently change the electrical characteristics of a memory cell to output the intended threshold voltage level. After each memory cell programming pass, the threshold voltage distribution of the MLC memory cells changes (e.g., one or more MLC memory cells previously associated with one threshold voltage level are now associated with a different threshold voltage level). To determine whether electrical characteristics of MLC memory cells are sufficiently changed to output intended threshold voltage levels (e.g., threshold voltage levels corresponding to data intended to be written to those cells), program verify operations are used.

A program verify operation can be used between each memory cell programming pass to determine the threshold voltage distribution of the MLC memory cells. In this manner, the program verify operations are used after each memory cell programming pass to determine whether electrical characteristics of the MLC memory cells are correctly configured to represent the intended data. For example, if a file is written to 2bpc MLC memory cells in which the data of the file is to be represented by 25 MLC memory cells at threshold voltage level L0, 25 MLC memory cells at threshold voltage level L1, 25 MLC memory cells at threshold voltage level L2, and 25 MLC memory cells at threshold voltage level L3, the program verify operations can be used to determine whether a threshold voltage distribution of the MLC memory cells correctly represents the distribution at the corresponding threshold voltage levels L0-L3 required to store the file data. When the correct threshold voltage level distribution is not met, additional memory cell programming passes can be used to further change the electrical characteristics of the MLC memory cells until the intended threshold voltage level distribution is met.

In flash memory devices, memory cells are addressed by activating wordlines (e.g., rows) and bitlines (e.g., columns) such that a memory cell is activated when it is at the intersection of an active wordline and an active bitline. The addressed memory cell can then be written or read. Program verify operations that are based on keeping a single bitline in a fixed active state while cycling through different wordlines to address different rows of memory cell arrays require a significant amount of time due to extensive resistance-capacitance (RC) delay associated with the cycles of activating and deactivating the wordlines.

In addition, prior program verify techniques that activate or precharge all bitlines to verify memory cells corresponding to only some of the bitlines introduce undesired bias voltages onto source (SRC) plates of flash memory die and, thus, on SRC terminals of memory cell transistors. For example, when such prior program verify techniques are used to verify MLC memory cells corresponding to a particular intended threshold voltage, all bitlines are precharged or activated regardless of whether such bitlines correspond to MLC memory cells of the intended threshold voltage (e.g., target memory cells of the program verify operation). In such instances, when threshold voltages of non-target MLC memory cells on precharged bitlines are much less than transistor gate-to-source voltages ($V_{TH} \ll Vgs$) used to activate a corresponding wordline, electrical current injected into the transistors of those non-target MLC memory cells discharges very quickly through their SRC terminals into a SRC plate of the flash memory die. This rapid discharge is due to the significant voltage difference between the threshold voltages and the gate-to-source voltages ($V_{TH} \ll Vgs$) of the non-target memory cells. The rapid discharge into the SRC plate creates a SRC bounce which is the development of an undesired voltage bias on the SRC plate such that the voltage bias is applied to all SRC terminals of MLC memory cell transistors. As such, the undesired voltage bias affects subsequent threshold voltage readings of the MLC memory cells by making those threshold voltage levels appear larger than what the electrical characteristics of the MLC memory cells have been programmed to output. To undo these effects on threshold voltage levels, a subsequent bitline precharge phase could be used to reverse, undo, or otherwise remove the SRC bounce voltage bias from the SRC plate. However, using such a subsequent phase to remove the SRC bounce voltage bias undesirably increases a page programming time (tPROG) for programming memory cells of a MLC flash memory device.

Examples disclosed herein may be used to perform program verify operations in MLC flash memory devices to confirm whether target cells are programmed with intended data. For example, techniques disclosed herein may be used to perform program verify operations during a write operation of a single row or page of data such that a single row or page is kept active until the write and program verify operations confirm that intended data is correctly persisted in corresponding memory cells. When intended data is correctly written to a particular row, a current wordline can be deactivated and a next wordline can be activated to perform write and program verify operations on that next wordline (e.g., a row or page) of memory cells. In this manner, the timing effects of RC delay associated with cycling through multiple wordlines can be substantially decreased by not needing to cycle through multiple wordlines during a program verify operation. In addition, example program verify operations disclosed herein selectively precharge only some bitlines corresponding to target memory cells that are to be programmed to a particular target threshold voltage. In this manner, MLC memory cells with much lower target threshold voltages ($V_{TH}$) do not result in an undesirable SRC bounce voltage bias from gate-to-source voltages (Vgs) that discharge rapidly into a SRC plate. By substantially preventing SRC bounce voltage bias, a page programming time (tPROG) does not need to be increased to accommodate a subsequent bitline precharge phase to remove the SRC bounce voltage bias.

FIG. 1 illustrates an example memory controller 102 to perform program verify operations on a multi-level cell (MLC) flash memory 104 to confirm that intended data is stored therein. For example, the MLC flash memory 104 includes a plurality of memory cells that are generally referred to herein using reference numeral 106 and some of which are shown in FIG. 1 as target memory cells (TCs) 106a, 106b, 106c and non-target memory cells (non-TCs) 106d and 106e. In the illustrated example, the target memory cells $TC_A$ 106a, $TC_B$ 106b, and $TC_C$ 106c of the MLC flash memory 104 are memory cells targeted by a program verify operation during a data write process to confirm that they persist intended data. The non-target memory cells non-$TC_D$ 106d and non-$TC_E$ 106e are memory cells that are not targeted by a program verify operation. For different program verify operations, different memory cells 106 are designated target memory cells depending on what data is being verified. For example, one program verify operation may check memory cells 106 that are intended to store a binary value of one (e.g., 001) and, thus, any memory cell 106 in a wordline intended to store a binary one is designated a target memory cell. A subsequent program verify operation may check memory cells 106 that are intended to store a binary value of three (e.g., 011) and, thus, any memory cell 106 in a wordline intended to store a binary three is designated a target memory cell. The MLC flash memory 104 of the illustrated example is a three bit-per-cell (3bpc) memory as described in greater detail below in connection with FIG. 2. However, examples disclosed herein may be implemented in connection with MLC flash memories or any other suitable types of memories that store fewer bits per cell (e.g., 2bpc) or more bits per cell (e.g., 4bpc, 5bpc, etc.).

In the illustrated example, the target memory cells $TC_A$ 106a, $TC_B$ 106b, and $TC_C$ 106c, and the non-target memory cells non-$TC_D$ 106d and non-$TC_E$ 106e are located in a same wordline (WL(0)) 108 (e.g., a row). Also in the illustrated example, each of the target memory cells $TC_A$ 106a, $TC_B$ 106b, and $TC_C$ 106c, and the non-target memory cells non-$TC_D$ 106d and non-$TC_E$ 106e is located on a corresponding bitline (BL) shown as BL(0) 110a, BL(1) 110b, BL(2) 110c, BL(3) 110d, and BL(4) 110e. Each of the target memory cells $TC_A$ 106a, $TC_B$ 106b, and $TC_C$ 106c, and the non-target memory cells non-$TC_D$ 106d and non-$TC_E$ 106e of the illustrated example is addressed by activating the wordline (WL(0)) 108 and precharging a corresponding one of the bitlines BL(0) 110a, BL(1) 110b, BL(2) 110c, BL(3) 110d, and BL(4) 110e.

The memory controller 102 of the illustrated example is configured to perform program verify processes in accordance with the teachings disclosed herein by selecting target cells (e.g., $TC_A$ 106a, $TC_B$ 106b, and $TC_C$ 106c) and using selective precharging of bitlines to verify data written to the selected target cells. For example, program verify processes disclosed herein are performed in connection with memory cell programming passes of MLC memory cells so that a write operation to a page or wordline of MLC memory cells is completed after the program verify process confirms that all intended data is successfully written to the MLC memory cells. For example, after a memory cell programming pass to change electrical characteristics of the target cells $TC_A$ 106a, $TC_B$ 106b, and $TC_C$ 106c to store corresponding data, the memory controller 102 performs a program verify operation on the target cells $TC_A$ 106a, $TC_B$ 106b, and $TC_C$ 106c to confirm that the intended data is correctly stored in the target cells $TC_A$ 106a, $TC_B$ 106b, and $TC_C$ 106c.

In the illustrated example, during a program verify process, the memory controller 102 causes the wordline WL(0) 108 to be ramped to a verify wordline read voltage (VWLRV) as described in greater detail below in connection with FIG. 2. In addition, the memory controller 102 causes selective precharging of first bitlines BL(0) 110a, BL(2) 110c, and BL(3) 110d corresponding to the target cells $TC_A$ 106a, $TC_B$ 106b, and $TC_C$ 106c of the wordline WL(0) 108 without precharging second bitlines BL(1) 110b and BL(4) 110e of non-target cells (non-TCs) of the same wordline WL(0) 108. During a first time corresponding to a pre-program verify (PPV) strobe, the memory controller 102 obtains first outputs of the target cells $TC_A$ 106a, $TC_B$ 106b, and $TC_C$ 106c represented in FIG. 1 as an example PPV strobe state 112. The example PPV strobe state 112 includes a binary zero or one for each of the target cells $TC_A$ 106a, $TC_B$ 106b, and $TC_C$ 106c corresponding to sensed threshold voltages ($V_{STH}$) output by the target cells $TC_A$ 106a, $TC_B$ 106b, and $TC_C$ 106c. The sensed threshold voltages ($V_{STH}$) are indicative of the electrical characteristics programmed into transistors of the target cells $TC_A$ 106a, $TC_B$ 106b, and $TC_C$ 106c during a memory cell programming pass. The programmed electrical characteristics allow more or less electrical current to flow through the target cells $TC_A$ 106a, $TC_B$ 106b, and $TC_C$ 106c to generate a threshold voltage ($V_{TH}$) representative of data stored therein.

In the illustrated example, each memory cell of the MLC flash memory 104 is provided with a temporary cache capacitor 116 that is in circuit with a corresponding wordline (WL). Example temporary cache capacitors are generally referred to herein using reference numeral 116, which is shown by way of example in FIG. 1 in connection with the temporary cache capacitor of the target cell $TC_A$ 106a. In the illustrated example, the temporary cache capacitors 116 of the target cells $TC_A$ 106a, $TC_B$ 106b, and $TC_C$ 106c are biased with a charge during the PPV strobe so that the PPV strobe state 112 is representative of the threshold voltages output by the target cells $TC_A$ 106a, $TC_B$ 106b, and $TC_C$ 106c based on the bias held in the temporary cache capacitor 116. During a second time corresponding to a program verify (PV) strobe, the memory controller 102 obtains second outputs of the target cells $TC_A$ 106a, $TC_B$ 106b, and $TC_C$ 106c of FIG. 1 as an example PV strobe state 114. In the illustrated example, the temporary cache capacitor 116 is unbiased during the PV strobe so that the PV strobe state 114 of the target cells $TC_A$ 106a, $TC_B$ 106b, and $TC_C$ 106c is representative of the sensed threshold voltages output by the target cells $TC_A$ 106a, $TC_B$ 106b, and $TC_C$ 106c without the biasing charge held in the temporary cache capacitor 116. The biasing on the temporary cache capacitors 116 is described in more detail below in connection with FIGS. 3 and 4A-4C.

In the illustrated example, the memory controller 102 includes an example PPV target cell map 120 and an example PV target cell map 122. The memory controller 102 uses the PPV target cell map 120 to store the PPV strobe state 112. For example, the PPV target cell map 120 holds one binary bit for each of the target cells $TC_A$ 106a, $TC_B$ 106b, and $TC_C$ 106c representative of whether the sensed threshold voltage of that target cell exceeded a trip voltage level (e.g., a trip voltage level 332 of FIGS. 3 and 4A-4C) as described below in connection with FIGS. 3 and 4A-4C. The memory controller 102 uses the PV target cell map 122 to store the PV strobe state 114. For example, the PV target cell map 122 holds one binary bit for each of the target cells $TC_A$ 106a, $TC_B$ 106b, and $TC_C$ 106c representative of whether the sensed threshold voltage of that target cell exceeded the trip voltage level as described in connection with FIGS. 3 and 4A-4C.

In the illustrated example, the memory controller 102 uses the PPV strobe state 112 and the PV probe state 114 to determine which one or more of the target cells $TC_A$ 106a, $TC_B$ 106b, and $TC_C$ 106c is/are not fully programmed such that they have not yet reached a target threshold voltage representing intended data that should be stored in those target cells. For not fully programmed target cells, the example memory controller 102 also uses the PPV strobe state 112 and the PV probe state 114 to determine how close those not fully programmed target cells are to the target threshold voltage. In this manner, the memory controller 102 can control voltage levels of subsequent programming pulses used on the not fully programmed target cells to prevent changing the electrical characteristics of those target cells too much such that resulting threshold voltages of those target cells would exceed or overshoot the target threshold voltage.

In the illustrated example, the memory controller 102 uses a full program pulse (PGM) 126 to program (e.g., change electrical characteristics of) memory cells having threshold voltages that are relatively far away from a target threshold voltage. In addition, the example memory controller 102 uses a partial program pulse (SSPC—Selective Slow Program Convergence) 128 to program memory cells having threshold voltages that are relatively close to a target threshold voltage. In this manner, electrical characteristics of memory cells that are relatively close to their intended target threshold voltages can be programmed in small increments using the partial program pulse 128 to avoid producing threshold voltages in those memory cells that exceed their intended target threshold voltages that correctly represent data intended to be stored therein. In addition, the electrical characteristics of memory cells that are relatively far away from their intended target threshold voltages can be programmed in larger increments using the full program pulse 126 to more quickly approach and reach the intended target threshold voltages.

In the illustrated example of FIG. 1, if the sensed threshold voltage level of the target cell $TC_A$ 106a is relatively close to the target threshold voltage such that a small program pulse is needed to configure the target cell $TC_A$ 106a to reach the intended target threshold voltage, the memory controller 102 may use the partial program pulse 128 to further program the target cell $TC_A$ 106a by causing a small incremental change to its electrical characteristics. Also in the illustrated example, if the sensed threshold voltage level of the target cell $TC_B$ 106b is relatively far from the intended target threshold voltage such that a larger program pulse is needed to configure the target cell $TC_B$ 106b to reach the target threshold voltage, the memory controller 102 may further program the target cell $TC_B$ 106b using the full program pulse 126 having a relatively higher voltage than the first partial program pulse 128. In this manner, the memory controller 102 can perform further programming on both of the target cells $TC_A$ 106a and $TC_B$ 106b using respective programming pulse voltage levels so that the threshold voltages output by the target cells $TC_A$ 106a and $TC_B$ 106b are representative of the intended data to be stored without overshooting or exceeding the target threshold voltages corresponding to that intended data. In addition, for target memory cells that have already reached their target threshold voltages, the memory controller 102 can inhibit (INH) further programming pulses from being applied to those target memory cells during subsequent memory cell programming passes.

In the illustrated example, the memory controller 102 and the MLC flash memory 104 may be integrated into a single flash memory integrated circuit (IC) package 130. For example, the memory controller 102 and the MLC flash memory 104 may be on the same die and placed into the IC package 130, or may be on separate die and bonded to one another in the same IC package 130. Alternatively, the memory controller 102 may be in a separate IC package from the MLC flash memory 104.

Figure 2:
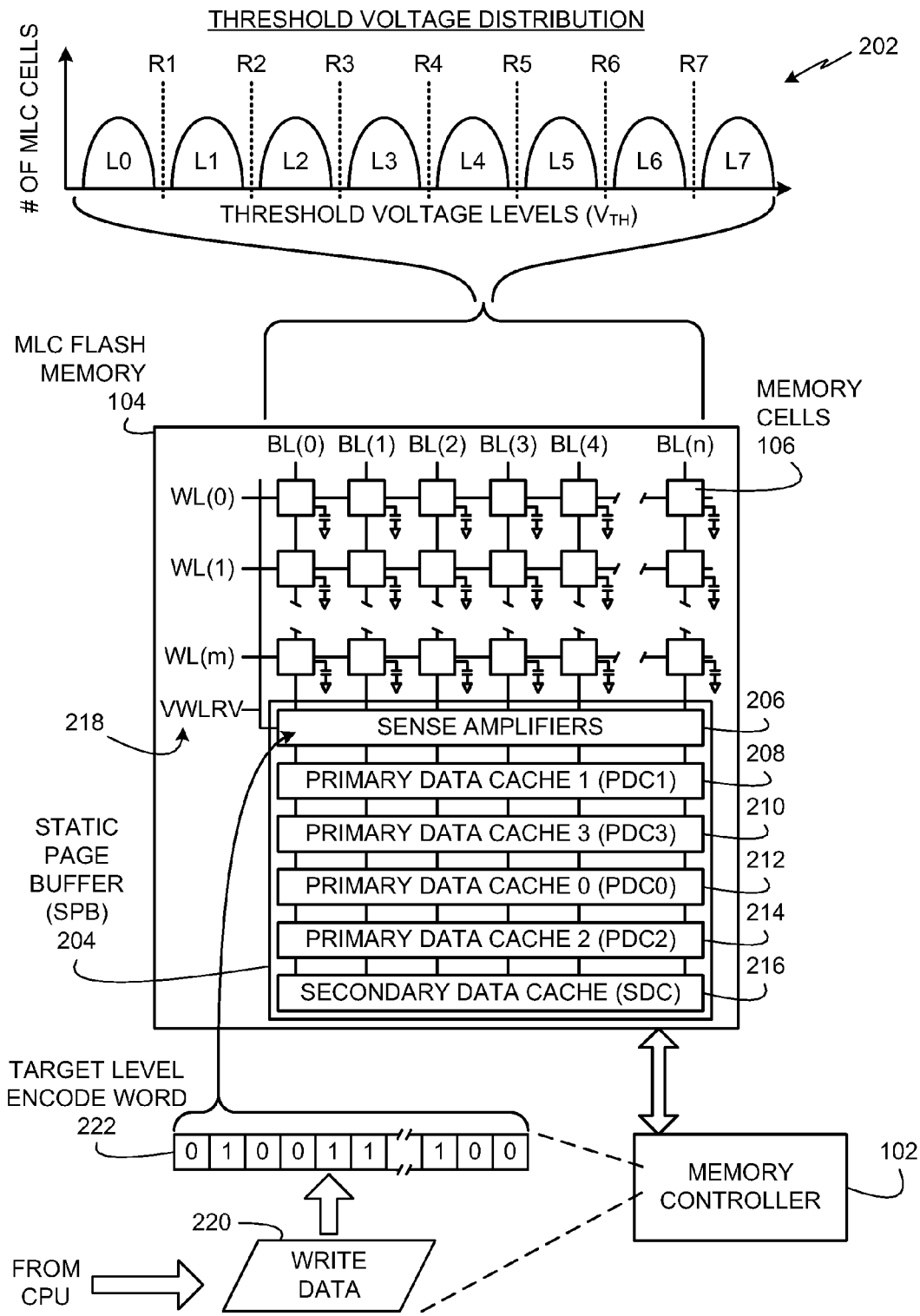
FIG. 2 is another view of the example memory controller and the example MLC flash memory of FIG. 1.

Turning to FIG. 2, the MLC flash memory 104 of the illustrated example stores three bits-per-cell (3bpc) based on eight threshold voltage levels ($V_{TH}$) shown in FIG. 2 as L0-L7 of a threshold voltage distribution 202. In the illustrated example, different ones of the memory cells 106 are programmable to different ones of the plurality of threshold voltages ($V_{TH}$) to store corresponding ones of the multi-bit binary values. For example, the threshold voltage levels ($V_{TH}$) L0-L7 are representative of different corresponding multi-bit binary values (e.g., L0: 000; L1: 001; L2: 010; L3: 011; L4: 100; L5: 101; L6: 110; L7: 111) that can be stored in the memory cells 106 by programming or changing the electrical characteristics of the memory cells 106. For example, each memory cell 106 includes a transistor having electrical characteristics configurable to output one of the threshold voltage levels ($V_{TH}$) (e.g., a threshold voltage level of the transistor), thereby indicating a stored one of the multi-bit binary values.

The threshold voltage distribution 202 of the illustrated example is indicative of the number of memory cells 106 programmed to different ones of the threshold voltage levels ($V_{TH}$). In the illustrated example, the threshold voltage levels ($V_{TH}$) L0-L7 are separated by reference voltages R1-R7. The reference voltages R1-R7 form boundaries within which the threshold voltage levels ($V_{TH}$) L0-L7 must be located to represent a corresponding multi-bit binary value. For example, if threshold voltage level L1 represents binary value 001, a memory cell 106 intended to store the binary value 001 must output a threshold voltage that is between reference voltages R1 and R2.

As shown in the illustrated example, the MLC flash memory 104 includes a plurality of wordlines WL(0)-WL(m) and bitlines BL(0)-BL(n). In the illustrated example, the variable 'm' represents the total number of wordlines or pages in the MLC flash memory 104, and the variable 'n' represents the memory cell width (e.g., total number of memory cells 106) of each wordline or page of the MLC flash memory 104. The example memory cells 106 are located at intersections of the wordlines WL(0)-WL(m) and bitlines BL(0)-BL(n). Each memory cell 106 is accessed by activating (e.g., precharging) a corresponding one of the wordlines (WL) and a corresponding one of the bitlines (BL). In this manner, precharging the wordline (WL) applies a gate-to-source voltage (Vgs) to a gate terminal of a transistor of the desired memory cell 106 which allows electrical current to flow between a drain terminal and a source terminal of the desired memory cell 106. The programmed electrical characteristics of the memory cell 106 control the amount of electrical current flow between the drain and source terminals when the corresponding bitline (BL) is precharged. The amount of electrical current flow corresponds to a threshold voltage level of the memory cell 106. As such, different multi-bit binary values can be stored in the memory cells 106 by programming the transistors of the memory cells 106 to allow more or less electrical current to flow between corresponding drain and source terminals to control the threshold voltage levels output from the memory cells 106.

In the illustrated example, the electrical characteristic of a memory cell 106 that is changed during a memory cell programming pass corresponds to a floating gate of a transistor in the memory cell 106. For example, to control the amount of electrical current flow between the drain and source terminals of the transistor of the memory cell 106, a programming pulse (e.g., the full programming pulse 126 or the partial programming pulse 128 of FIG. 1) is used to change the electron charge on the floating gate of the transistor. Changing the electron charge changes the amount of electrical current that flows through the transistor of the memory cell 106. The amount of current flow is proportional to a resulting threshold voltage level ($V_{TH}$) of that memory cell 106 which is, in turn, representative of the multi-bit binary value stored in that memory cell 106. As such, different multi-bit binary values can be stored in the memory cells 106 by using the full programming pulse 126 or the partial programming pulse 128 of FIG. 1 to change the electrical characteristics of the memory cells 106.

The MLC flash memory 104 of the illustrated example includes an example static page buffer (SPB) 204 that includes sense amplifiers 206 and numerous data caches. The data caches of the illustrated example include an example primary data cache 1 (PDC1) 208, an example primary data cache 3 (PDC3) 210, an example primary data cache 0 (PDC0) 212, an example primary data cache 2 (PDC2) 214, and an example secondary data cache (SDC) 216. In the illustrated example, the PDC0 212, the PDC2 214, and the SDC 216 are used to write and read 3-bit binary data (e.g., bits b2:b1:b0) to and from the memory cells 106. For example, in the 3bpc MLC flash memory 104, the PDC0 212 holds a lower page (LP) of data (e.g., a zeroeth bit (b0)) of a 3-bit binary value, the PDC2 214 holds an upper page (UP) of data (e.g., a first bit (b1)) of the 3-bit binary value, and the SDC 216 holds an extra page (XP) of data (e.g., a second bit (b2)) of the 3-bit binary value.

The primary data caches PDC1 208 and PDC3 210 of the illustrated example are used to perform program verify operations to determine whether intended data is correctly written to the memory cells 106. For example, the primary data caches PDC1 208 and PDC3 210 hold the PPV strobe state 112 (FIG. 1) and the PV strobe state 114 (FIG. 1), respectively, which include 1-bit binary values representative of sensed threshold voltages from the target memory cells $TC_A$ 106a, $TC_B$ 106b, and $TC_C$ 106c of FIG. 1. The sensed threshold voltages are sensed at different times during a program verify operation to determine whether the target memory cells $TC_A$ 106a, $TC_B$ 106b, and $TC_C$ 106c store intended data. Although the example primary data cache PDC1 208, the example primary data cache 3 PDC3 210, the example primary data cache 0 PDC0 212, the example primary data cache 2 PDC2 214, and the example secondary data cache SDC 216 are described as being used for particular data in examples disclosed herein, the uses of these data caches can be rearranged. For example, the PDC0 212 and the PDC2 214 may instead be used for program verify operations, and the PDC1 208, the PDC3 210 and the SDC 216 may instead be used for holding read and write data. Any other suitable combinations of the data caches may alternatively be used.

The sense amplifiers 206 of the illustrated example sense threshold voltage levels from the memory cells 106 when different wordlines (WLs) and bitlines (BLs) are activated. For example, during a program verify operation, a wordline (e.g., the wordline WL(0) 108 of FIG. 1) containing the target memory cells to be verified such as the target memory cells $TC_A$ 106a, $TC_B$ 106b, and $TC_C$ 106c of FIG. 1 is activated by ramping a verify wordline read voltage (VWLRV) 218 on the wordline. In addition, select ones of the bitlines (e.g., the bitlines 110a, 110c, 110d of FIG. 1) of the active wordline are precharged to sense the threshold voltage levels ($V_{TH}$) of the target memory cells $TC_A$ 106a, $TC_B$ 106b, and $TC_C$ 106c. The example sense amplifiers 206 then latch binary zeros or ones as sense amplifier output (SAout) data into the primary data cache PDC1 208 or the primary data cache PDC3 210 based on the sensed threshold voltage levels from the target memory cells $TC_A$ 106a, $TC_B$ 106b, and $TC_C$ 106c of FIG. 1 as described below in connection with FIGS. 3 and 4A-4C. For example, the PPV strobe state 112 of the target memory cells $TC_A$ 106a, $TC_B$ 106b, and $TC_C$ 106c described above in connection with FIG. 1 is latched into the primary data cache PDC1 208 by the sense amplifiers 206 during a PPV strobe. In addition, the PV strobe state 114 of the target memory cells $TC_A$ 106a, $TC_B$ 106b, and $TC_C$ 106c described above in connection with FIG. 1 is latched into the primary data cache PDC3 210 by the sense amplifiers 206 during a PV strobe. In this manner, the memory controller 102 uses the PPV strobe state 112 and the PV strobe state 114 latched by the sense amplifiers 206 to control further programming of the target memory cells $TC_A$ 106a, $TC_B$ 106b, and $TC_C$ 106c.

Figure 7:
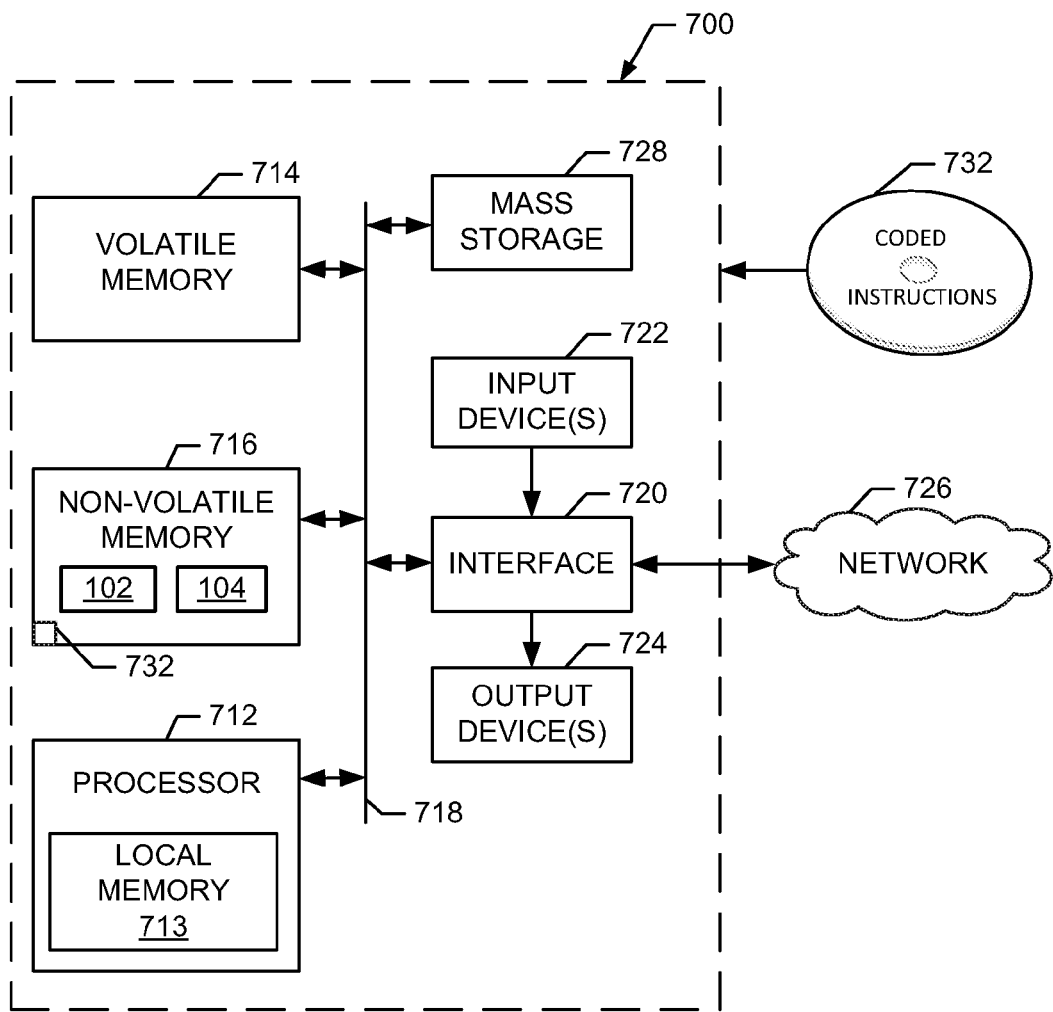
FIG. 7 is an example processor platform capable of executing machine readable instructions represented by the example instructions of FIGS. 6A and 6B to implement the example memory controller of FIGS. 1, 2, and/or 5 to perform program verify operations in accordance with the teachings of this disclosure.

In the illustrated example, during a write process, the memory controller 102 receives write data 220 from a processor (e.g., the processor 712 of FIG. 7). The write data 220 may be data from a user or from a process executed by the processor. During the write process, the memory controller 102 performs one or more memory cell programming passes on the memory cells 106 to store the write data 220 and performs one or more program verify operations to confirm that the write data 220 is correctly written to corresponding ones of the memory cells 106 as intended. To perform the program verify operations using examples disclosed herein, the memory controller 102 collects the PPV strobe state 112 and the PV strobe state 114 described above in connection with FIG. 1. The PPV strobe state 112 and the PV strobe state 114 collected during a particular program verify operation correspond to a targeted one of the threshold voltage levels ($V_{TH}$) L0-L7 (e.g., a target threshold voltage level ($V_{TTH}$)) of the threshold voltage distribution 202 that is being verified during that program verify operation. Since only some memory cells 106 of a wordline (WL) are written or programmed to the target threshold voltage ($V_{TTH}$), the memory controller 102 generates a target level encode word 222 based on the write data 220 to mask out memory cells 106 that are not programmed to the target threshold voltage level ($V_{TTH}$) and to indicate target memory cells (e.g., the target memory cells $TC_A$ 106a, $TC_B$ 106b, and $TC_C$ 106c of FIG. 1) that are intended to be programmed to the target threshold voltage level ($V_{TTH}$). In the illustrated example, a binary zero '0' in the target level encode word 222 is used to represent a target cell such as one of the target memory cells $TC_A$ 106a, $TC_B$ 106b, and $TC_C$ 106c of FIG. 1, and a binary one in the target level encode word 222 is used to represent a masked out memory cell that is not a target cell.

The memory controller 102 of the illustrated example loads the target level encode word 222 into the sense amplifiers 206 so that the sense amplifiers 206 latch binary values into the PPV strobe state 112 and the PV strobe state 114 for only the target memory cells $TC_A$ 106a, $TC_B$ 106b, and $TC_C$ 106c corresponding to the target threshold voltage level ($V_{TTH}$). In addition, since only some of the memory cells 106 in a wordline (WL) are target memory cells, examples disclosed herein can be used to selectively activate or precharge only some bitlines (BL) of a wordline (WL) corresponding to the target threshold voltage level ($V_{TTH}$) during a particular program verify operation. For example, in a 3bpc flash memory, verifying a particular one of the eight threshold voltage levels ($V_{TH}$) L0-L7 allows enabling only one-eighth of the bitlines (BLs) (e.g., only bitlines corresponding to memory cells 106 intended to be programmed to the target threshold voltage level ($V_{TTH}$)). In this manner, examples disclosed herein are useful to conserve power during program verify operations and to reduce adjacent bitline coupling noise between bitlines (BLs) by selectively activating only some of the bitlines (BLs) during program verify operations. Reducing power usage is useful for conserving battery power and extending battery life in battery-operated devices such as mobile telephones, tablet computers, laptop computers, portable media players, digital cameras, global positioning system (GPS) devices, etc. In addition, reducing adjacent bitline coupling noise between neighboring bitlines (BLs) reduces the likelihood of electrical noise from unintentionally changing electrical characteristics of adjacent memory cells 106, thereby, improving data integrity of the MLC flash memory 104.

Figure 3:
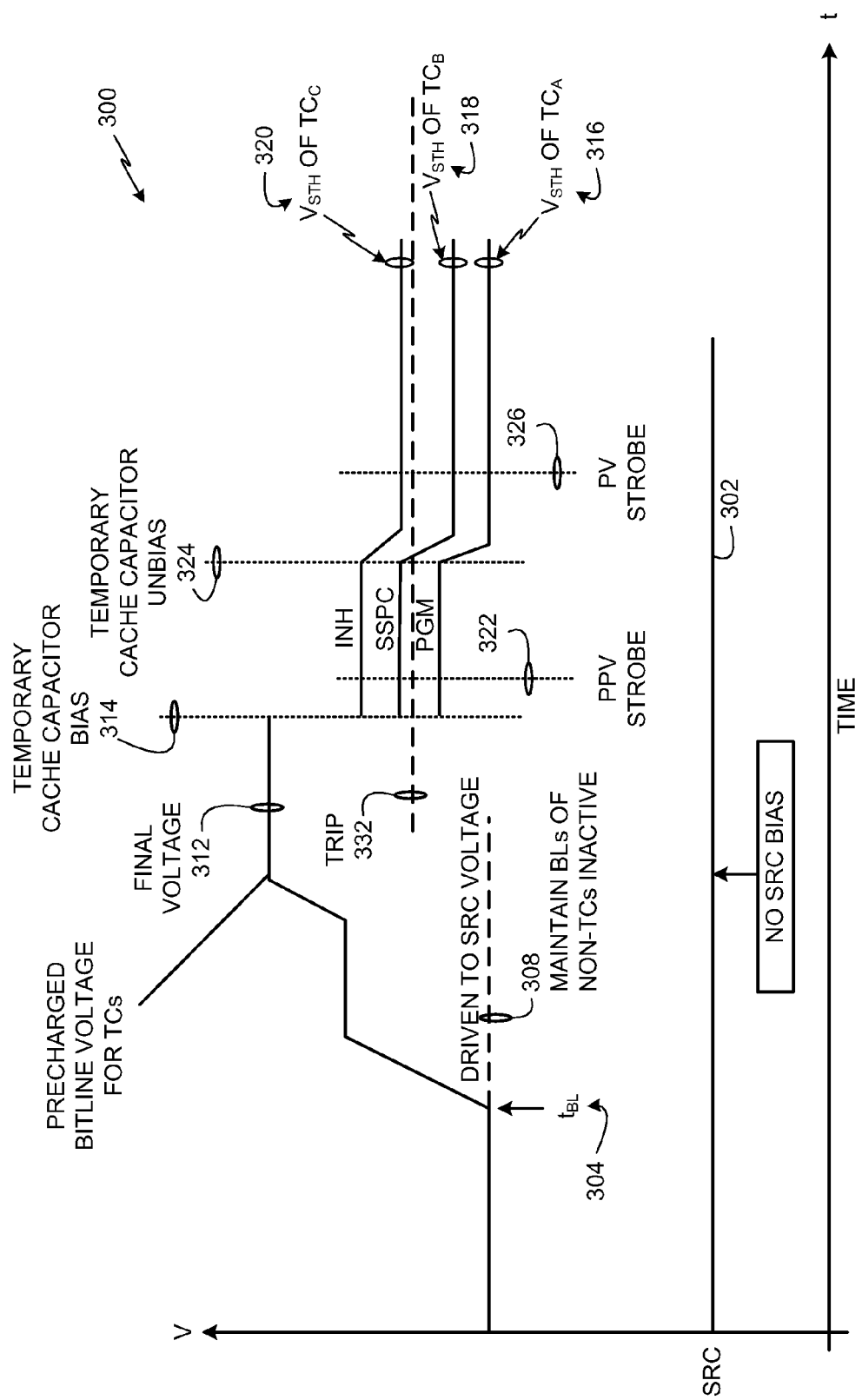
FIG. 3 is a timeline of an example program verify operation showing precharging of target cells and resulting threshold voltages indicative of whether such target cells have reached a target threshold voltage level to persist intended data.

FIG. 3 is an example program verify operation timeline 300 showing precharging of target memory cells (e.g., the target cells $TC_A$ 106a, $TC_B$ 106b, and $TC_C$ 106c of FIG. 1) and sensed threshold voltage levels ($V_{STH}$) indicative of whether such target memory cells have reached a target threshold voltage level to persist intended information. The example program verify operation timing diagram 300 includes a horizontal time axis along which different events of the memory controller 102 and the MLC flash memory 104 of FIGS. 1 and 2 are shown during a program verify operation. The example program verify operation timing diagram 300 includes a vertical voltage axis to represent different voltages used during the program verify operation. The example horizontal time axis and the example vertical voltage axis are not to scale. For example, some events along the horizontal time axis may take more or less time than represented in FIG. 3. In addition, some voltage levels represented in FIG. 3 may be greater or less than how such voltage levels are represented in FIG. 3 relative to other shown voltage levels.

The illustrated example of FIG. 3 shows a source (SRC) line voltage level 302 to show that the source terminals of transistors in the memory cells 106 (FIGS. 1 and 2) are kept at common ground without an SRC bounce voltage bias during the program verify operation. By selectively precharging only bitlines corresponding to target memory cells intended to be programmed to output a target threshold voltage level, examples disclosed herein substantially reduce or prevent the SRC bounce voltage bias on the SRC line voltage level 302 when the verify wordline read voltage (VWLRV) 218 on the active wordline (WL) supplies the gate-to-source voltages (Vgs) of target memory cell transistors. That is, by precharging only selective bitlines corresponding to target memory cells that are likely to have threshold voltages ($V_{TH}$) that are close to the gate-to-source voltages (Vgs) of the target memory cells, inactive (non-precharged) non-target memory cells having a much lower target threshold voltage level ($V_{TH}$) than the gate-to-source voltages (Vgs) will not cause a rapid discharge of electrical current from the gate-to-source voltages (Vgs) to an SRC plate of the MLC flash memory 104. Substantially preventing or reducing such rapid discharges into the SRC plate of the MLC flash memory 104 prevents SRC bounce voltage bias on the SRC plate, which keeps the SRC line voltage level 302 substantially near or at common ground. This prevents threshold voltage levels of subsequent memory cell readings from being biased by a SRC bounce voltage bias. In addition, by substantially preventing SRC bounce voltage bias, a page programming time (tPROG) of the MLC flash memory 104 does not need to be increased to accommodate a subsequent bitline precharge phase to remove the SRC bounce voltage bias.

The illustrated example of FIG. 3 also shows an example bitline precharge time ($t_{BL}$) 304 at which selective bitlines (BLs) (e.g., bitlines BL(0)-BL(n) of FIGS. 1 and 2) are precharged based on the target level encode word 222 (FIG. 2) to obtain sensed threshold voltage levels ($V_{STH}$) of target memory cells (e.g., the target cells $TC_A$ 106a, $TC_B$ 106b, and $TC_C$ 106c of FIG. 1). In the illustrated example, before the example bitline precharge time ($t_{BL}$) 304, the memory controller 102 selects a target threshold voltage level ($V_{TTH}$) that is to be verified from one of the threshold voltage levels ($V_{TH}$) of the threshold voltage distribution 202 of FIG. 2. The memory controller 102 then determines the target level encode word 222 (FIG. 2) based on the write data 220 (FIG. 2) and based on the selected target threshold voltage level ($V_{TTH}$). For example, the memory controller 102 selects 3bpc groups in the write data 220 having the same 3-bit binary value corresponding to the selected target threshold voltage level ($V_{TTH}$) and generates the target level encode word 222 to mask non-target memory cells (e.g., the non-$TC_D$ 106d and the non-$TC_E$ 106e of FIG. 2) that are not intended to be written to that target threshold voltage level ($V_{TTH}$). The example memory controller 102 then loads the target level encode word 222 into the sense amplifiers 206. In this manner, the sense amplifiers 206 latch binary values corresponding to sensed threshold voltage levels ($V_{STH}$) of only the target cells $TC_A$ 106a, $TC_B$ 106b, and $TC_C$ 106c without latching binary values corresponding to sensed threshold voltage levels ($V_{STH}$) of the non-target cells non-$TC_D$ 106d and the non-$TC_E$ 106e. In the illustrated examples disclosed herein, instead of latching binary values corresponding to sensed threshold voltage levels ($V_{STH}$) of the non-target cells non-$TC_D$ 106d and the non-$TC_E$ 106e, the sense amplifiers 206 latch binary ones for the non-target cells non-$TC_D$ 106d and the non-$TC_E$ 106e.

In the illustrated example, before the bitline precharge time ($t_{BL}$) 304, the memory controller 102 activates the wordline (WL) corresponding to the target cells $TC_A$ 106a, $TC_B$ 106b, and $TC_C$ 106c. For example, the memory controller 102 ramps up the wordline (WL) to the verify wordline read voltage (VWLRV) 218 of FIG. 2. In the illustrated example, the VWLRV 218 is selected to be the selected target threshold voltage level ($V_{TTH}$) of a program verify operation. As such, the voltage applied to the VWLRV 218 is dependent on which target threshold voltage level ($V_{TTH}$) is selected for a particular program verify operation. In some examples, the memory controller 102 sets the VWLRV 218 to a voltage closer to the next higher reference voltage (e.g., R1-R7 of FIG. 2) adjacent the target threshold voltage level ($V_{TTH}$). By controlling the voltage for the VWLRV 218, the memory controller 102 can control where to establish the threshold voltage distribution 202 of FIG. 2.

In the illustrated example, at the bitline precharge time ($t_{BL}$) 304, the memory controller 102 causes selective precharging of the bitlines BL(0) 110a, BL(2) 110c, and BL(3) 110d corresponding to the target cells $TC_A$ 106a, $TC_B$ 106b, and $TC_C$ 106c without precharging the bitlines 110b, 110e corresponding to the non-target cells non-$TC_D$ 106d and non-$TC_E$ 106e. As shown in the illustrated example of FIG. 3, the bitlines 110b, 110e corresponding to the non-target cells non-$TC_D$ 106d and non-$TC_E$ 106e are maintained inactive 308 by being driven to a source (SRC) voltage (e.g., the same SRC voltage, such as common ground, to which source terminals of memory cell transistors are driven).

In the illustrated example, bitlines are precharged to a supply voltage (Vcc) of the MLC flash memory 104. In the illustrated example, when the selectively precharged bitlines BL(0) 110a, BL(2) 110c, and BL(3) 110d corresponding to the target cells $TC_A$ 106a, $TC_B$ 106b, and $TC_C$ 106c reach a final voltage 312 (e.g., the supply voltage (Vcc) of the MLC flash memory 104), the temporary cache capacitors (e.g., the temporary cache capacitor 116 of FIG. 1) of the target cells $TC_A$ 106a, $TC_B$ 106b, and $TC_C$ 106c are biased 314 with a positive charge to increase the threshold voltage levels ($V_{TH}$) that are output by the target cells $TC_A$ 106a, $TC_B$ 106b, and $TC_C$ 106c. In the illustrated example, the sensed threshold voltage levels ($V_{STH}$) of the target cells $TC_A$ 106a, $TC_B$ 106b, and $TC_C$ 106c that are sensed by the sense amplifiers 206 are shown as $V_{STH}$ of $TC_A$ 316, $V_{STH}$ of $TC_B$ 318, and $V_{STH}$ of $TC_C$ 320.

After applying the temporary cache capacitor bias 314 of the illustrated example, the memory controller 102 asserts an example PPV strobe 322 to cause the sense amplifiers 206 to latch binary values representative of the sensed threshold voltage levels ($V_{STH}$) of the target cells $TC_A$ 106a, $TC_B$ 106b, and $TC_C$ 106c (e.g., the $V_{STH}$ of $TC_A$ 316, the $V_{STH}$ of $TC_B$ 318, and the $V_{STH}$ of $TC_C$ 320). In this manner, the binary values latched by the sense amplifiers 206 during the PPV strobe 322 form the PPV strobe state 112 of FIG. 1. After the PPV strobe 322, the memory controller 102 unbiases 324 the temporary cache capacitors 116. As shown in the illustrated example of FIG. 3, unbiasing 324 the temporary cache capacitors 116 causes the threshold voltage levels ($V_{TH}$) output by the target cells $TC_A$ 106a, $TC_B$ 106b, and $TC_C$ 106c to decrease. After unbiasing 324 the temporary cache capacitors 116, the memory controller 102 asserts an example PV strobe 326 to cause the sense amplifiers 206 to latch binary values representative of the sensed threshold voltage levels ($V_{STH}$) of the target cells $TC_A$ 106a, $TC_B$ 106b, and $TC_C$ 106c (e.g., the $V_{STH}$ of $TC_A$ 316, the $V_{STH}$ of $TC_B$ 318, and the $V_{STH}$ of $TC_C$ 320). In this manner, the binary values latched by the sense amplifiers 206 during the PV strobe 326 form the PV strobe state 114 of FIG. 1.

In the illustrated example, the sense amplifiers 206 have an example trip voltage level 332 that controls whether the sense amplifiers 206 latch a binary zero '0' or a binary for a sensed threshold voltage level ($V_{STH}$). In the illustrated example, the sense amplifiers 206 latch a binary for sensed threshold voltage levels ($V_{STH}$) above the trip voltage level 332, and latch a binary '0' for sensed threshold voltage levels ($V_{STH}$) below the trip voltage level 332. In the illustrated example, the trip voltage level 332 is set to the VWLRV 218, which is provided to the sense amplifiers 206 as shown in FIG. 2. That is, the trip voltage level 332 is set based on a selected target threshold voltage level ($V_{TTH}$) used to set the VWLRV 218.

In the illustrated example, the temporary cache capacitor bias 314 applied to the temporary cache capacitors 116 (FIG. 1) is selected so that the trip voltage level 332 is satisfied during the PPV strobe 322 by sensed threshold voltage levels ($V_{STH}$) of target memory cells requiring only a partial program pulse (e.g., the partial program pulse 128 of FIG. 1) to reach their corresponding target threshold voltage levels ($V_{TTH}$) and so that the trip voltage level 332 is not satisfied during the PV strobe 326 by the sensed threshold voltage levels ($V_{STH}$) of those same target memory cells. Selecting the temporary cache capacitor bias 314 in this manner causes sensed threshold voltage levels ($V_{STH}$) of target memory cells that are already fully programmed (e.g., that satisfy their corresponding target threshold voltage levels ($V_{TTH}$)) to exceed the trip voltage level 332 at the PPV strobe 322 and at the PV strobe 326. In addition, such selecting of the temporary cache capacitor bias 314 causes sensed threshold voltage levels ($V_{STH}$) of target memory cells that require a full program pulse (e.g., full program pulse 126 of FIG. 1) to be less than the trip voltage level 332 at the PPV strobe 322 and at the PV strobe 326.

In the illustrated example, the sensed threshold voltages $V_{STH}$ of $TC_A$ 316, $V_{STH}$ of $TC_B$ 318, and $V_{STH}$ of $TC_C$ 320 are shown relative to the trip voltage level 332 during the PPV strobe 322 (when the temporary cache capacitor bias 314 is applied to the temporary cache capacitors 116) and the PV strobe 326 (when the temporary cache capacitors 116 are unbiased 324). The sensed threshold voltages $V_{STH}$ of $TC_A$ 316, $V_{STH}$ of $TC_B$ 318, and $V_{STH}$ of $TC_C$ 320 relative to the trip voltage level 332 are used by the memory controller 102 to determine whether the corresponding target cells $TC_A$ 106a, $TC_B$ 106b, and $TC_C$ 106c require the full program pulse 126, the partial program pulse 128, or no program pulse to reach the selected target threshold voltage level ($V_{TTH}$). Examples of using the sensed threshold voltages $V_{STH}$ of $TC_A$ 316, $V_{STH}$ of $TC_B$ 318, and $V_{STH}$ of $TC_C$ 320 to select a type of program pulse or no program pulse are described below in connection with FIGS. 4A-4C.

In examples disclosed herein, since sensing of voltage threshold voltage levels ($V_{TH}$) is done based on bitline (BL) precharging, the biasing 314 and unbiasing 324 of the temporary cache capacitors 116 are used to create a voltage stepping effect on the active wordline (WL) that, from the bitline (BL) perspective, appears to move the trip voltage level 332 from a lower trip voltage level 332 during the PPV strobe 322 to a higher trip voltage level 332 during the PV strobe 326. After applying the target threshold voltage ($V_{TTH}$) (or a slightly larger voltage as explained above) to the VWLRV 218 (FIG. 2), target memory cells needing the partial program pulse 128 will discharge at a faster rate than target memory cells not needing any further program pulse such that the sensed threshold voltage levels ($V_{STH}$) of the target memory cells needing the partial program pulse 128 are lower than the target memory cells not needing any further program pulse. Also, the target memory cells needing the partial program pulse 128 will discharge at a slower rate than target memory cells needing the full program pulse 126 such that the sensed threshold voltage levels ($V_{STH}$) of the target memory cells needing the partial program pulse 128 are higher than the target memory cells needing the full program pulse 126.

To create the voltage stepping effect between the PPV strobe 322 and the PV strobe 326 on the active wordline (WL), the voltage level of the bias 314 applied to the temporary cache capacitors 116 is selected so that during the PPV strobe 322 the sensed threshold voltage levels ($V_{STH}$) of target memory cells needing the partial program pulse 128 are higher than the trip voltage level 332. In addition, the voltage level of the bias 314 is selected such that when the temporary cache capacitors 116 are unbiased 324 after the PPV strobe 322, the sensed threshold voltage levels ($V_{STH}$) of target memory cells needing the partial program pulse 128 are less than the trip voltage level 332 during the PV strobe 326. By using the biasing 314 and unbiasing 324 of the temporary cache capacitors 116 in this manner, a single unchanged trip voltage level 332 can be used to generate the latched binary values at the sense amplifiers 206 (FIG. 2) that form the PPV strobe state 112 stored in the PPV target cell map 120 of FIG. 1 and the PV strobe state 114 stored in the PV target cell map 122.

Figure 4A:
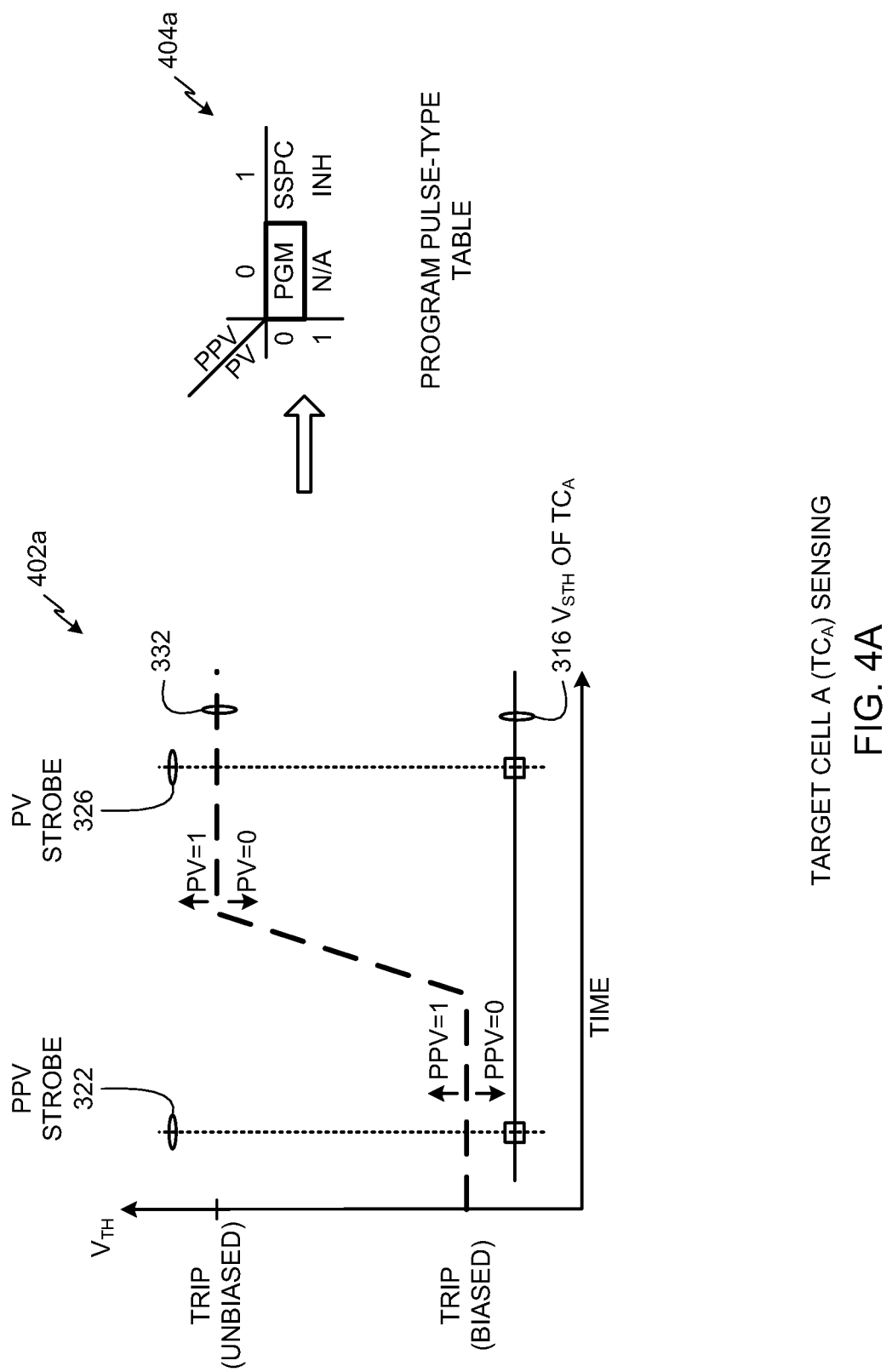
FIGS. 4A-4C depict example sensed threshold voltages of target MLC memory cells used to determine types of programming pulses to use for further programming the MLC memory cells to persist intended data.
Figure 4B:
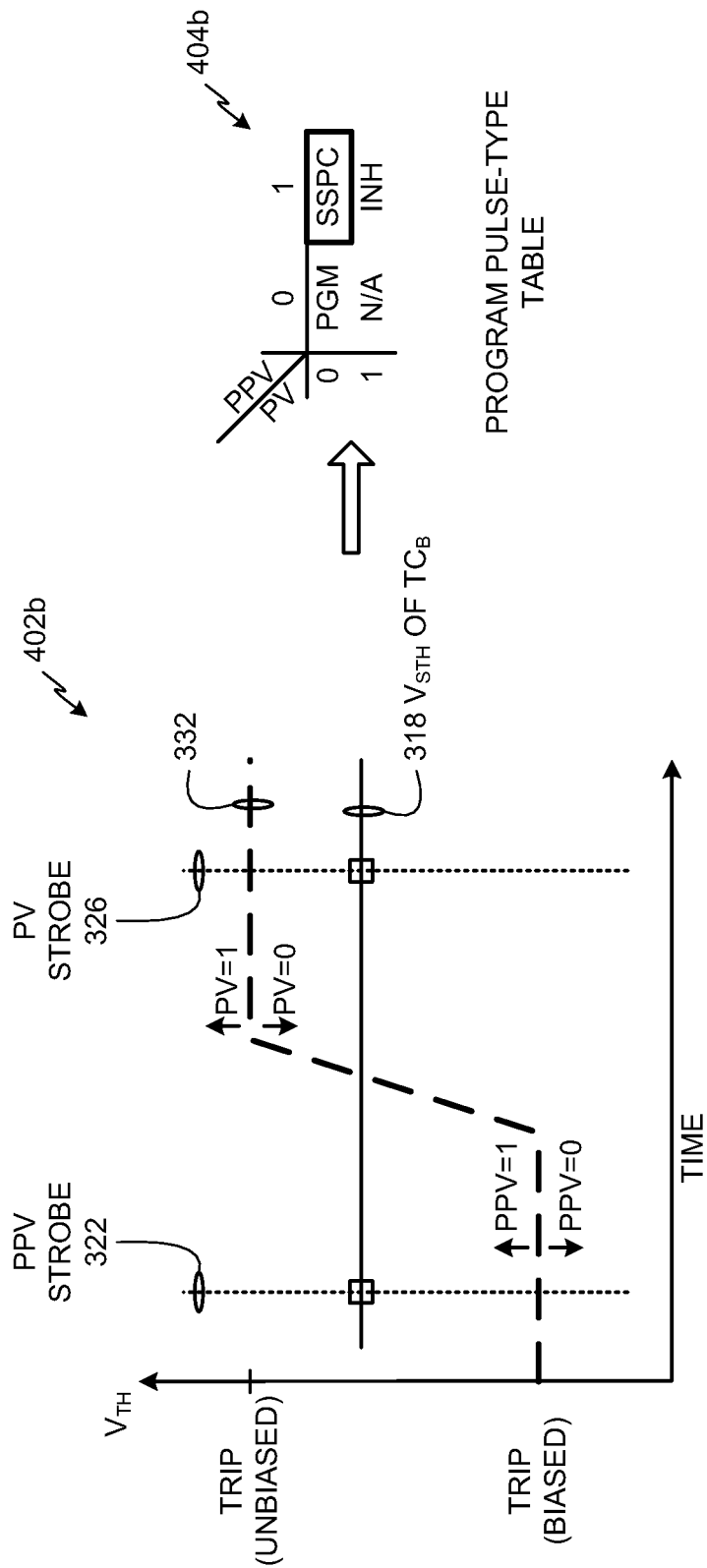
Figure 4C:
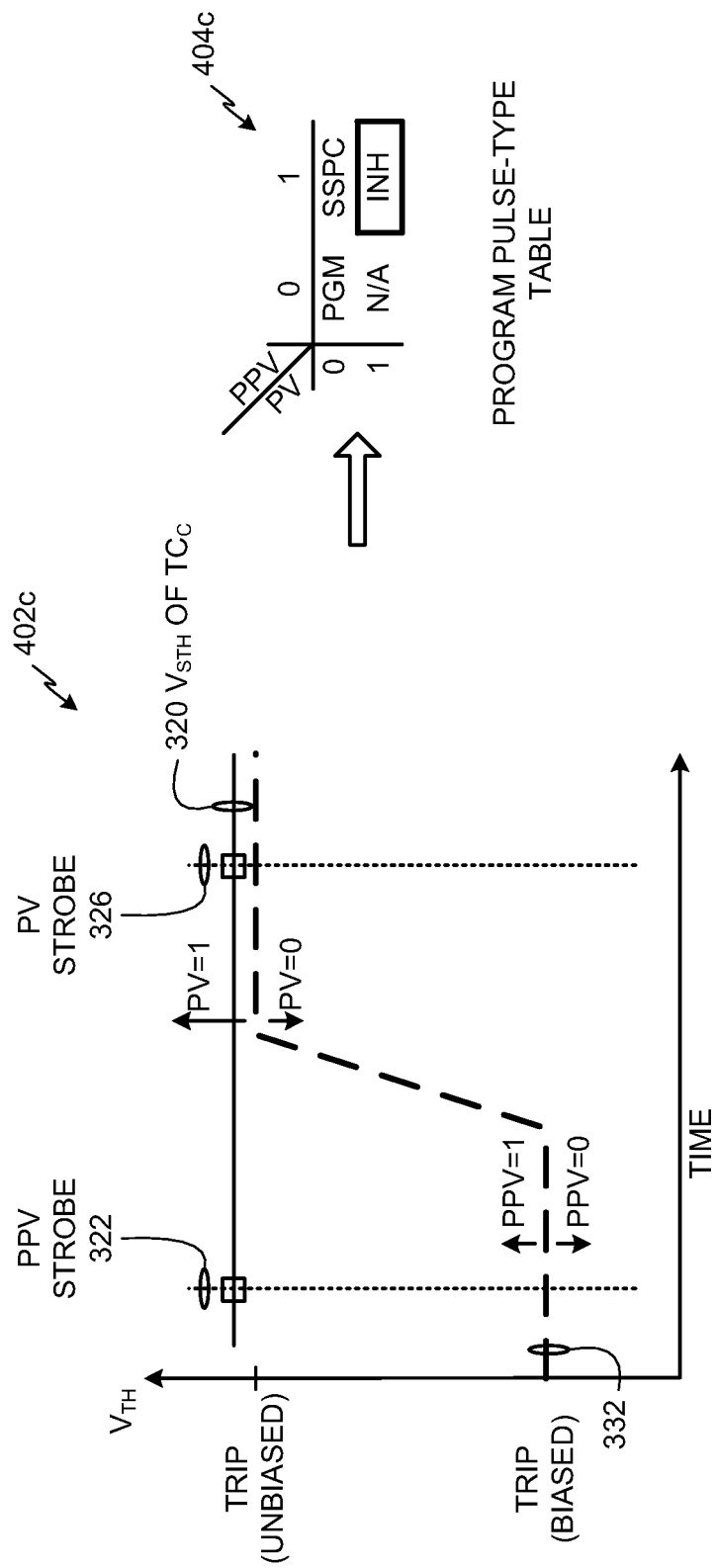

FIGS. 4A-4C illustrate threshold voltage level ($V_{TH}$) vs. time graphs 402a, 402b, 402c showing how the trip voltage level 332 appears relative to the example sensed threshold voltages $V_{STH}$ of $TC_A$ 316, $V_{STH}$ of $TC_B$ 318, and $V_{STH}$ of $TC_C$ 320 when the voltage stepping effect between the PPV strobe 322 and the PV strobe 326 is created on the active wordline (WL) based on biasing the temporary cache capacitors 116 (FIG. 1). FIGS. 4A-4C also illustrate example program pulse-type tables 404a-404c showing binary values latched by the sense amplifiers 206 (FIG. 2) during the PPV strobe 322 and the PV strobe 326 based on comparisons between the trip voltage level 332 and the sensed threshold voltages $V_{STH}$ of $TC_A$ 316, $V_{STH}$ of $TC_B$ 318, and $V_{STH}$ of $TC_C$ 320 of the target cells $TC_A$ 106a, $TC_B$ 106b, and $TC_C$ 106c. The example program pulse-type tables 404a-404c also shows how such latched binary values are used to determine a type of programming pulse (or whether no programming pulse is needed) to use for further programming the target cells $TC_A$ 106a, $TC_B$ 106b, and $TC_C$ 106c to persist intended data.

In the illustrated example, the program pulse-type tables 404a-404c include selections of a full program pulse (PGM), a partial program pulse (SSPC—Selective Slow Program Convergence), and an inhibit (INH) for corresponding ones of the sensed threshold voltages $V_{STH}$ of $TC_A$ 316, $V_{STH}$ of $TC_B$ 318, and $V_{STH}$ of $TC_C$ 320. The full program pulse (PGM) of the illustrated examples corresponds to the full program pulse 126 of FIG. 1 which is used to further program target memory cells that are very far from their target threshold voltage levels ($V_{TTH}$). The partial program pulse (SSPC) of the illustrated examples corresponds to the partial program pulse 128 of FIG. 1 which is used to further program target memory cells that are close to their target threshold voltage levels ($V_{TTH}$). The inhibit (INH) option of the program pulse-type tables 404a-404c is used to inhibit or prevent further programming of target memory cell that have already reached their target threshold voltage levels ($V_{TTH}$). Inhibiting or preventing further programming of such target memory cells prevents the electrical characteristics of those target memory cells from being further changed so that resulting output threshold voltages will not overshoot or exceed the intended target threshold voltages corresponding to data intended to be stored in those target memory cells.

Turning to FIG. 4A, target threshold voltage ($V_{TTH}$) sensing and program pulse-type selection for the target cell $TC_A$ 106a (FIG. 1) are shown. In the $V_{TH}$ vs. time graph 402a, the voltage step effect of the trip voltage level 332 is shown as the trip voltage level 332 being at a lower voltage during the PPV strobe 322 when its corresponding temporary cache capacitor 116 (FIG. 1) is biased 314 (FIG. 3), and is shown as being at a higher voltage during the PV strobe 326 when its corresponding temporary cache capacitor 116 is unbiased 324 (FIG. 3). In the illustrated example of FIG. 4A, the sensed threshold voltage $V_{STH}$ of $TC_A$ 316 is less than the trip voltage level 332 during both the PPV strobe 322 and the PV strobe 326. In the illustrated example, when a sensed threshold voltage level ($V_{STH}$) is below the trip voltage level 332, the sense amplifiers 206 (FIG. 2) latch a binary zero CO'. For example, during the PPV strobe 322 of FIG. 4A, the sense amplifiers 206 latch a binary zero '0' into the primary data cache PDC1 208 for the target cell $TC_A$ 106a. In addition, during the PV strobe 326 of FIG. 4A, the sense amplifiers 206 latch a binary zero '0' into the primary data cache PDC3 210 for the target cell $TC_A$ 106a. As shown in the program pulse-type table 404a, the binary zero '0' values latched during the PPV strobe 322 and the PV strobe 326 indicate that a full program pulse (PGM) (e.g., the full program pulse 126 of FIG. 1) is needed to further program the target cell $TC_A$ 106a to reach the intended target threshold voltage ($V_{TTH}$).

Turning to FIG. 4B, target threshold voltage ($V_{TTH}$) sensing and program pulse-type selection for the target cell $TC_B$ 106b (FIG. 1) are shown. In the illustrated example of FIG. 4B, the sensed threshold voltage $V_{STH}$ of $TC_B$ 318 is higher than the trip voltage level 332 during the PPV strobe 322 and is lower than the trip voltage level 332 during the PV strobe 326. As such, during the PPV strobe 322 of FIG. 4B, the sense amplifiers 206 latch a binary one into the primary data cache PDC1 208 for the target cell $TC_B$ 106b. In addition, during the PV strobe 326 of FIG. 4B, the sense amplifiers 206 latch a binary zero '0' into the primary data cache PDC3 210 for the target cell $TC_B$ 106b. As shown in the program pulse-type table 404b, the binary one value latched during the PPV strobe 322 and the binary zero '0' value latched during the PV strobe 326 indicate that a partial program pulse (SSPC) (e.g., the partial program pulse 128 of FIG. 1) is needed to further program the target cell $TC_B$ 106b to reach the intended target threshold voltage ($V_{TTH}$).

Turning to FIG. 4C, target threshold voltage ($V_{TTH}$) sensing and program pulse-type selection for the target cell $TC_C$ 106c (FIG. 1) are shown. In the illustrated example of FIG. 4C, the sensed threshold voltage $V_{STH}$ of $TC_C$ 320 is higher than the trip voltage level 332 during both the PPV strobe 322 and the PV strobe 326. As such, during the PPV strobe 322 of FIG. 4C, the sense amplifiers 206 latch a binary one '1' into the primary data cache PDC1 208 for the target cell $TC_C$ 106c. In addition, during the PV strobe 326 of FIG. 4B, the sense amplifiers 206 latch a binary one into the primary data cache PDC3 210 for the target cell $TC_C$ 106c. As shown in the program pulse-type table 404c, the binary one value latched during the PPV strobe 322 and the binary one '1' value latched during the PV strobe 326 indicate that further program pulses need to be inhibited (INH) from further programming the target cell $TC_C$ 106c. That is, the target cell $TC_C$ 106c has already reached the intended target threshold voltage ($V_{TTH}$).

In examples disclosed herein, since the sense amplifiers 206 latch binary ones for non-target cells (e.g., the non-target cells non-$TC_D$ 106d and the non-$TC_E$ 106e) based on the target level encode word 222 (FIG. 2) having binary ones to mask the non-target cells, the PPV strobe state 112 and the PV strobe state 114 generated by the sense amplifiers 206 will include binary ones for non-target cells. As such, since the PPV state and the PV state of non-target cells are indicated as binary one the program pulse-type table 404c of FIG. 4C shows that the non-target cells are inhibited (INH) from receiving further memory cell programming pulses unless a subsequent program verify makes a previous non-target cell into a target cell for which a PPV state and/or PV state is latched by the sense amplifiers 206 as binary zero '0'.

Figure 5:
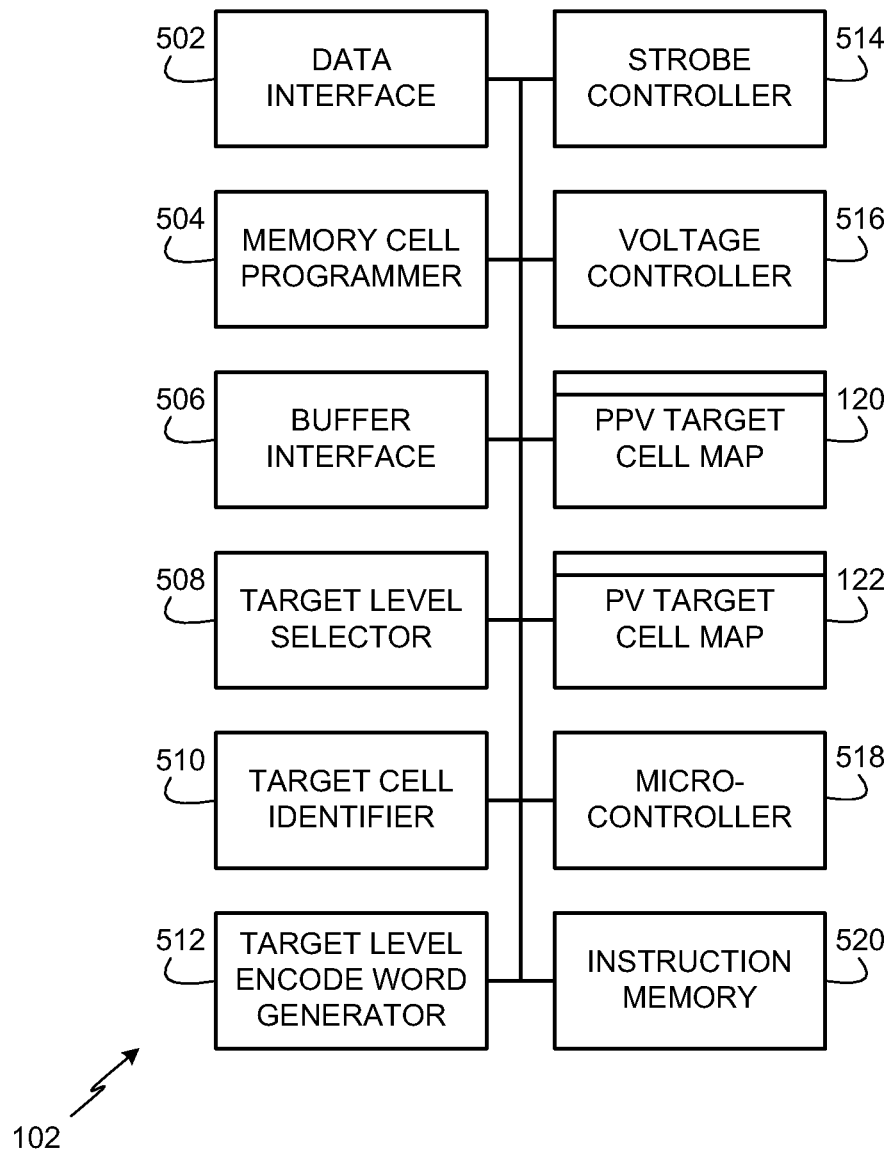
FIG. 5 is a block diagram of the example memory controller of FIGS. 1 and 2 that may be used to perform program verify operations in accordance with the teachings of this disclosure.

FIG. 5 is a block diagram of the example memory controller 102 (FIGS. 1 and 2) that may be used to perform program verify operations of target memory cells (e.g., the target memory cells $TC_A$ 106a, $TC_B$ 106b, and $TC_C$ 106c of FIG. 1). The example memory controller 102 includes an example data interface 502, an example memory cell programmer 504, an example buffer interface 506, an example target level selector 508, an example target cell identifier 510, an example target level encode word generator 512, an example strobe controller 514, an example voltage controller 516, the example PPV target cell map 120, the example PV target cell map 122, an example micro-controller 518, and an example instruction memory 520.

The example data interface 502 is provided to obtain the write data 220 (FIG. 2) from a CPU such as the processor 712 of FIG. 7 for writing to the MLC flash memory 104 (FIGS. 1 and 2). The example memory cell programmer 504 is provided to program memory cells 106 (FIGS. 1 and 2) of the MLC flash memory 104 using the full program pulse (PGM) 126 and/or the partial program pulse (SSPC) 128 of FIG. 1. The example buffer interface 506 is provided to load the write data 220 into the primary data caches PDC0 212, PDC2 214, and SDC 216 of FIG. 2. In addition, the example buffer interface 506 is provided to load the target level encode word 222 into the sense amplifiers 206 of FIG. 2. The example buffer interface 506 is also provided to obtain the PPV strobe state 112 (FIG. 1) from the primary data cache PDC1 208 (FIG. 2), obtain the PV strobe state 114 (FIG. 1) from the primary data cache PDC3 210 (FIG. 2), and to update the PPV target cell map 120 and the PV target cell map 122 based on corresponding ones of the PPV strobe state 112 and the PV strobe state 112.

The example target level selector 508 is provided to select one of the threshold voltage levels ($V_{TH}$) L0-L7 of the threshold voltage distribution 202 (FIG. 2) as a target threshold voltage level ($V_{TTH}$) during a program verify operation. The example target cell identifier 510 is provided to identify target memory cells (e.g., the target memory cells $TC_A$ 106a, $TC_B$ 106b, and $TC_C$ 106c of FIG. 1) to verify for the selected target threshold voltage level ($V_{TTH}$) during the program verify operation. For example, the target cell identifier 510 can identify target memory cells based on 3bpc groups in the write data 220 having the same 3-bit binary value corresponding to the selected target threshold voltage level ($V_{TTH}$). The example target level encode word generator 512 is provided to generate the target level encode word 222 (FIG. 2) based on the target memory cells identified by the target cell identifier 510. For example, the target level encode word generator 512 can store binary zeros '0' in locations of the target level encode word 222 corresponding to target memory cells (e.g., the target cells $TC_A$ 106a, $TC_B$ 106b, and $TC_C$ 106c) on a wordline (WL) that is to be verified and store binary ones in locations of the target level encode word 222 corresponding to non-target memory cells (e.g., the non-$TC_D$ 106d and the non-$TC_E$ 106e of FIG. 2). In this manner, the binary zeros '0' in the target level encode word 222 can be used to control the sense amplifiers 206 to latch only on sensed threshold voltage levels ($V_{STH}$) corresponding to target memory cells.

The example strobe controller 514 can be used to generate the PPV strobe 322 and the PV strobe 326 (FIGS. 3 and 4A-4C). The example voltage controller 516 is provided to control voltage levels applied to the MLC memory flash 104. For example, the voltage controller 516 controls ramping up of the wordlines (WLs) with, for example, the VWLRV 218 (FIG. 2), the precharging of bitlines (BLs), and/or the biasing 314 (FIG. 3) of temporary cache capacitors (e.g., the temporary cache capacitor 116 of FIG. 1) of target memory cells and the unbiasing 324 (FIG. 3) of the temporary cache capacitors. The example PPV target cell map 120 is provided to store the PPV strobe state 112 (FIG. 1). The example PV target cell map 122 is provided to store the PV strobe state 114 (FIG. 1).

The example micro-controller 518 is provided to execute machine readable instructions to implement one or more components of the memory controller 102 including any one or more components shown in FIG. 5. The example instruction memory 520 is provided to store machine readable instructions executable by the micro-controller 518 to implement one or more components of the memory controller 102 including any one or more components shown in FIG. 5. In some examples, the micro-controller 518 and the instruction memory 520 are omitted, and the components of the memory controller 102 are implemented in logic circuits and/or other suitable hardware. In some examples, some components of the memory controller 102 are implemented using machine readable instructions stored in the instruction memory 520 and executed by the micro-controller 518 and others of the components of the memory controller 102 are implemented in hardware.

While an example manner of implementing the memory controller 102 of FIGS. 1 and 2 is illustrated in FIG. 5, one or more of the elements, processes and/or devices illustrated in FIG. 5 may be combined, divided, re-arranged, omitted, eliminated and/or implemented in any other way. Further, the example data interface 502, the example memory cell programmer 504, the example buffer interface 506, the example target level selector 508, the example target cell identifier 510, the example target level encode word generator 512, the example strobe controller 514, the example voltage controller 516, the example PPV target cell map 120, the example PV target cell map 122, and/or, more generally, the example memory controller 102 of FIGS. 1, 2, and 5 may be implemented by hardware, software, firmware and/or any combination of hardware, software and/or firmware. Thus, for example, any of the example data interface 502, the example memory cell programmer 504, the example buffer interface 506, the example target level selector 508, the example target cell identifier 510, the example target level encode word generator 512, the example strobe controller 514, the example voltage controller 516, the example PPV target cell map 120, the example PV target cell map 122, and/or, more generally, the example memory controller 102 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example data interface 502, the example memory cell programmer 504, the example buffer interface 506, the example target level selector 508, the example target cell identifier 510, the example target level encode word generator 512, the example strobe controller 514, the example voltage controller 516, the example PPV target cell map 120, the example PV target cell map 122 is/are hereby expressly defined to include a tangible computer readable storage device or storage disk such as a memory, a digital versatile disk (DVD), a compact disk (CD), a Blu-ray disk, etc. storing the software and/or firmware. Further still, the example memory controller 102 of FIGS. 1, 2, and 5 may include one or more elements, processes and/or devices in addition to, or instead of, those illustrated in FIG. 5, and/or may include more than one of any or all of the illustrated elements, processes and devices.

Figure 6A:
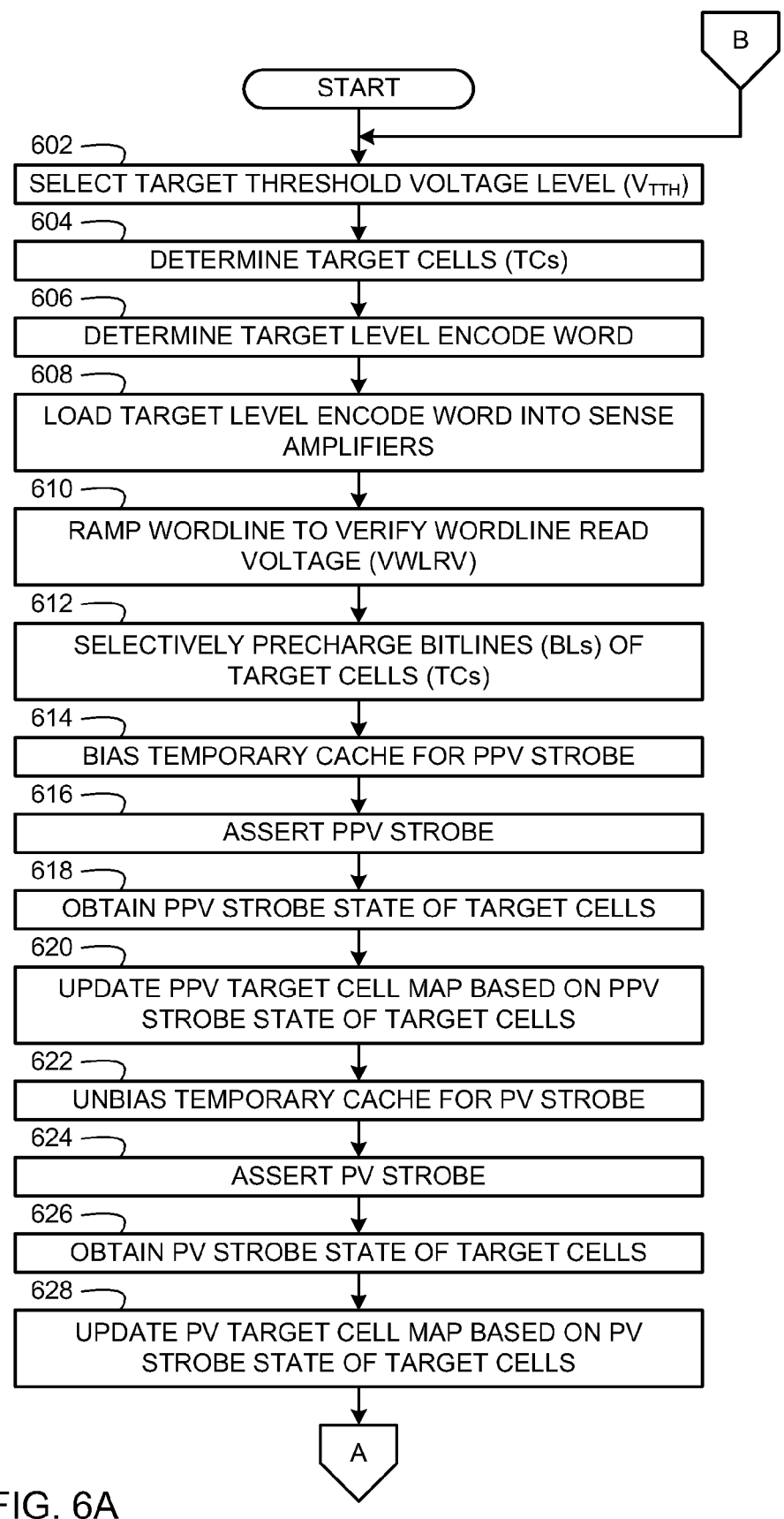
FIGS. 6A and 6B depict an example flow diagram representative of computer readable instructions that may be executed to implement the memory controller of FIGS. 1, 2, and 5 to perform program verify operations in accordance with the teachings of this disclosure.
Figure 6B:
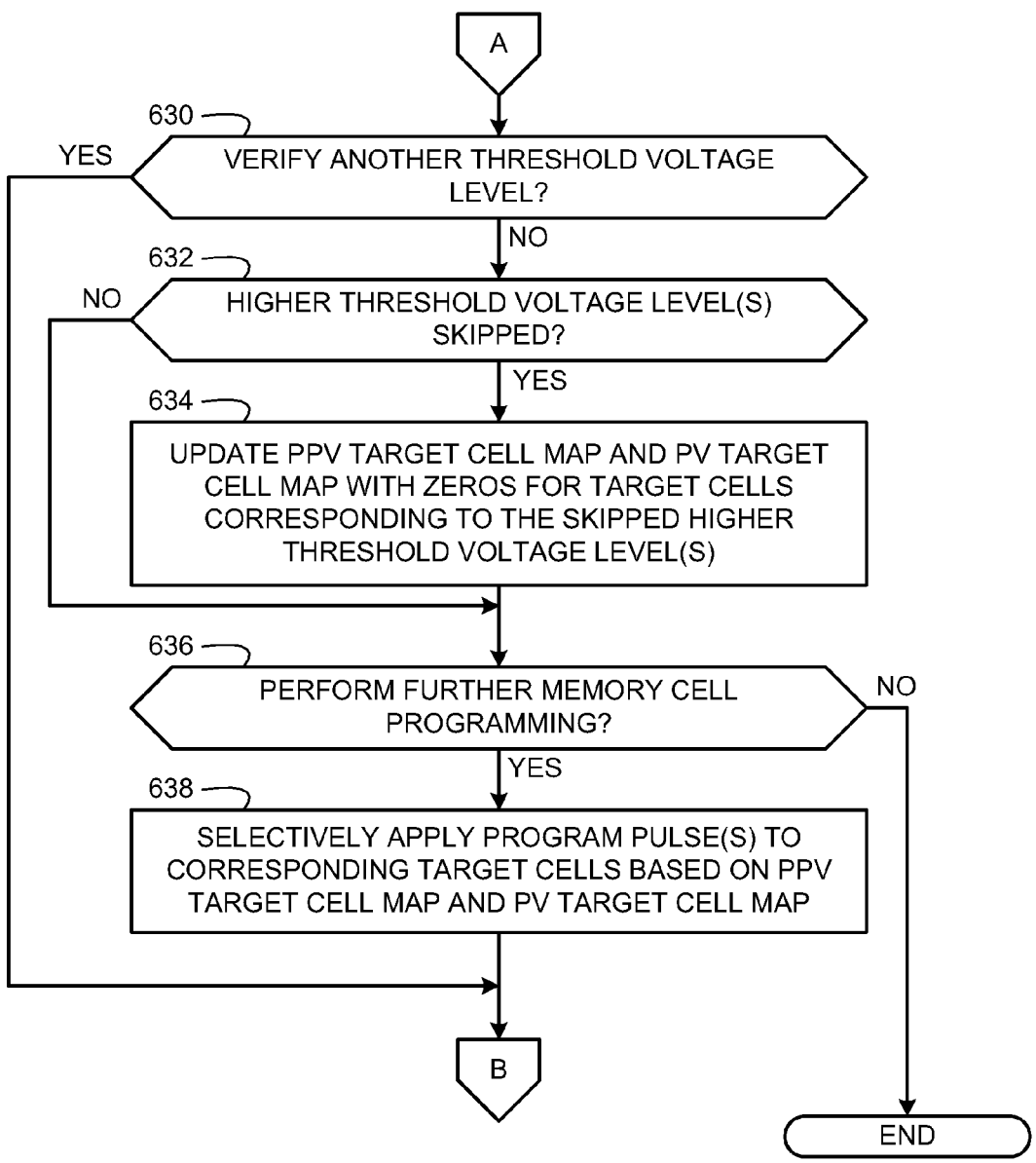

A flowchart representative of example machine readable instructions for implementing the memory controller 102 of FIGS. 1, 2, and 5 to perform program verify operations is shown in FIGS. 6A and 6B. In this example, the machine readable instructions include a program for execution by a processor or controller such as the micro-controller 518 of FIG. 5 and/or the memory controller 102 of FIGS. 1, 2, 5, and/or 7. The program may be embodied in software stored on a tangible computer readable storage medium such as a CD-ROM, a floppy disk, a hard drive, a digital versatile disk (DVD), a Blu-ray disk, or a memory (e.g., the instruction memory 520 of FIG. 5) associated with the micro-controller 518, but the entire program and/or parts thereof could alternatively be executed by a device other than the micro-controller 518 and/or embodied in firmware or dedicated hardware. Further, although the example program is described with reference to the flowchart illustrated in FIGS. 6A and 6B, many other methods of implementing the example memory controller 102 may alternatively be used. For example, the order of execution of the blocks may be changed, and/or some of the blocks described may be changed, eliminated, or combined.

As mentioned above, the example process of FIGS. 6A and 6B may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIGS. 6A and 6B may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

The example process of FIGS. 6A and 6B may be used during a program verify operation that is performed after the data interface 502 receives the write data 220 and the memory cell programmer 504 performs an initial programming of memory cells 106 (FIGS. 1 and 2) to store the write data 220 in the MLC flash memory 104. In this manner, the memory controller 102 can perform the program verify operation to determine whether intended multi-bit binary values from the write data 220 are correctly written to corresponding memory cells 106. The example process of FIGS. 6A and 6B may be used multiple times to perform numerous program verify operations with interspersed memory cell programming passes of the same write data 220 until the memory controller 102 confirms that all of the write data 220 is written correctly to the MLC flash memory 104. For example, after the memory cell programmer 504 performs a memory cell programming pass based on the write data 220, the example program verify process of FIGS. 6A and 6B can be used numerous times based on numerous ones of the threshold voltage levels ($V_{TH}$) of the threshold voltage distribution 202 (FIG. 2) as target threshold voltage levels ($V_{TTH}$) to determine whether the write data 220 is correctly written in the MLC flash memory 104 at each target threshold voltage level ($V_{TTH}$). If the program verify process of FIGS. 6A and 6B finds that any target threshold voltage level ($V_{TTH}$) is not fully programmed as intended, the memory cell programmer 504 performs another memory cell programming pass after which the memory controller 102 performs another number of program verify operations for the target threshold voltage levels ($V_{TTH}$). Numerous iterations of memory cell programming passes and program verify operations of the target threshold voltage levels ($V_{TTH}$) may be repeated until the write data 220 is successfully written to the MLC memory flash 104.

The example program verify process begins at block 602 of FIG. 6A at which the example target level selector 508 (FIG. 5) selects a target threshold voltage level ($V_{TTH}$) (block 602). For example, the target level selector 508 can select one of the threshold voltage levels ($V_{TH}$) L0-L7 of the threshold voltage distribution 202 (FIG. 2) as a target threshold voltage level ($V_{TTH}$). The example target cell identifier 510 (FIG. 5) determines target cells (block 604). For example, the target cell identifier 510 identifies the target memory cells $TC_A$ 106a, $TC_B$ 106b, and $TC_C$ 106c of FIG. 1 based on 3bpc groups in the write data 220 having the same 3-bit binary value corresponding to the selected target threshold voltage level ($V_{TTH}$). The example target level encode word generator 512 (FIG. 5) determines a target level encode word (block 606). For example, the target level encode word generator 512 determines the target level encode word 222 (FIG. 2) by storing binary zeros '0' in locations of the target level encode word 222 corresponding to target memory cells (e.g., the target cells $TC_A$ 106a, $TC_B$ 106b, and $TC_C$ 106c) on a wordline (WL) that are to be verified and storing binary ones '1' in locations of the target level encode word 222 corresponding to non-target memory cells (e.g., the non-$TC_D$ 106d and the non-$TC_E$ 106e of FIG. 2) on the wordline (WL) that are not to be verified. The example buffer interface 506 (FIG. 5) loads the target level encode word 222 into the sense amplifiers 206 (FIG. 2) (block 608).

The example voltage controller 516 ramps a current wordline (WL) to the verify wordline read voltage (VWLRV) 218 (FIG. 2) (block 610). For example, the voltage controller 516 ramps the VWLRV 218 on a wordline being verified to a voltage corresponding to the selected target threshold voltage level ($V_{TTH}$). The example voltage controller 516 selectively precharges the bitlines (BLs) of the identified target cells (block 612). For example, the voltage controller 516 uses the target level encode word 222 to selectively precharge the bitlines 110a, 110c, 110d corresponding to the target cells $TC_A$ 106a, $TC_B$ 106b, and $TC_C$ 106c of FIG. 1 without precharging the bitlines 110b and 110e of the non-target cells non-$TC_D$ 106d and non-$TC_E$ 106e of FIG. 1. The example voltage controller 516 biases the temporary cache capacitors of the target cells for the PPV strobe 322 of FIGS. 3 and 4A-4C (block 614). For example, the voltage controller 516 biases 314 (FIG. 3) the temporary cache capacitors 116 (FIG. 1) of the target cells $TC_A$ 106a, $TC_B$ 106b, and $TC_C$ 106c before the PPV strobe 322. The example strobe controller 514 (FIG. 5) asserts the PPV strobe 322 (block 616).

The example buffer interface 506 obtains the PPV strobe state 112 of the target cells $TC_A$ 106a, $TC_B$ 106b, and $TC_C$ 106c (block 618). For example, the PPV strobe state 112 includes binary values output by the sense amplifiers 206 (FIG. 2) for the target cells $TC_A$ 106a, $TC_B$ 106b, and $TC_C$ 106c based on the sensed threshold voltage levels $V_{STH}$ of $TC_A$ 316, $V_{STH}$ of $TC_B$ 318, and $V_{STH}$ of $TC_C$ 320 of FIGS. 3 and 4A-4C sensed by the sense amplifiers 206 at the PPV strobe 322 (FIGS. 3 and 4A-4C). The example buffer interface 506 updates the PPV target cell map 120 based on the PPV strobe state 112 of the target cells $TC_A$ 106a, $TC_B$ 106b, and $TC_C$ 106c (block 620).

The example voltage controller 516 unbiases the temporary cache capacitors of the target cells for the PV strobe 326 of FIGS. 3 and 4A-4C (block 622). For example, the voltage controller 516 unbiases 324 (FIG. 3) the temporary cache capacitors 116 (FIG. 1) of the target cells $TC_A$ 106a, $TC_B$ 106b, and $TC_C$ 106c between the assertions of the PPV strobe 322 and the PV strobe 326. The example strobe controller 514 asserts the PV strobe 326 (block 624). The example buffer interface 506 obtains the PV strobe state 114 of the target cells $TC_A$ 106a, $TC_B$ 106b, and $TC_C$ 106c (block 626). For example, the PV strobe state 114 includes binary values output by the sense amplifiers 206 for the target cells $TC_A$ 106a, $TC_B$ 106b, and $TC_C$ 106c based on the sensed threshold voltage levels $V_{STH}$ of $TC_A$ 316, $V_{STH}$ of $TC_B$ 318, and $V_{STH}$ of $TC_C$ 320 of FIGS. 3 and 4A-4C sensed by the sense amplifiers 206 at the PV strobe 326 (FIGS. 3 and 4A-4C). The example buffer interface 506 updates the PV target cell map 122 based on the PV strobe state 114 of the target cells $TC_A$ 106a, $TC_B$ 106b, and $TC_C$ 106c (block 628).

The memory controller 102 determines whether to perform a program verify on another threshold voltage level ($V_{TH}$) (block 630) (FIG. 6B). For example, the memory controller 102 may be configured to perform a program verify on every threshold voltage level ($V_{TH}$) following each memory cell programming pass performed by the memory cell programmer 504. Additionally or alternatively, the memory controller 102 may be configured to perform program verifies on only threshold voltage levels ($V_{TH}$) that are likely close to being satisfied by corresponding memory cells intended to be programmed to those threshold voltage levels ($V_{TH}$). For example, during a first memory cell programming pass based on newly received write data 220, it is likely that only memory cells intended to be programmed to lower threshold voltage levels L0-L3 are close to those intended lower threshold voltage levels or already satisfy those lower threshold voltage levels, and that memory cells intended to be programmed to higher threshold voltage levels L4-L7 are likely much farther from reaching those higher threshold voltage levels. This is due to program pulses (e.g., the full program pulse 126 and/or the partial program pulse 128 of FIG. 1) not having sufficient potential or voltage to fully program memory cells to the higher threshold voltage levels L4-L7 in a single memory cell programming pass. Thus, in some examples, the program verify process of FIGS. 6A and 6B may be used on only lower threshold voltage levels ($V_{TH}$) of the threshold voltage distribution 202 (FIG. 2). In such examples, default PPV strobe states 112 and PV strobe states 114 are generated for the higher threshold voltage levels L4-L7 in which binary zeros '0' are stored for memory cells intended to be programmed to the higher threshold voltage levels L4-L7 so that during a subsequent memory cell programming pass, those memory cells corresponding to the higher threshold voltage levels L4-L7 are programmed using the full program pulse (PGM) 126 of FIG. 1 to urge those memory cells closer to their intended higher threshold voltage levels.

In yet other examples, after memory cells intended to be written to the lower threshold voltage levels ($V_{TH}$) L0-L3 are already confirmed as being fully programmed based on one or more previous iterations of memory cell programming passes and program verifies, the program verify process of FIGS. 6A and 6B may be used on only the higher threshold voltage levels ($V_{TH}$) L4-L7 following a memory cell programming pass. In such circumstances, one or more iterations of the program verify process of FIGS. 6A and 6B following the memory cell programming pass is/are performed only on the higher threshold voltage levels ($V_{TH}$) L4-L7. In such examples, the PPV strobe states 112 and the PV strobe states 114 obtained from the sense amplifiers 206 will have binary ones for non-target memory cells corresponding to the lower threshold voltage levels L0-L3 because those memory cells are masked by the target level encode word 222 so that during a subsequent memory cell programming pass, those memory cells corresponding to the lower threshold voltage levels L0-L3 are inhibited (INH) from further programming pulses.

Although lower threshold voltage levels are described as levels L0-L3 and higher threshold voltage levels are described as levels L4-L7 in the above examples, different cutoffs between lower and higher threshold voltage levels may be used. For example, in some iterations of the program verify process of FIGS. 6A and 6B, only the threshold voltage level L0 may be referred to as a lower threshold voltage level. Additionally or alternatively, any one or more of the threshold voltage levels L0-L6 may be referred to as lower threshold voltage levels. Also, any one or more of the threshold voltage levels L1-L7 may be referred to as higher threshold voltage levels.

Returning to block 630 of FIG. 6B, if the memory controller 102 determines that a program verify should be performed on another threshold voltage level ($V_{TH}$), control returns to block 602 of FIG. 6A at which a next target threshold voltage level ($V_{TTH}$) is selected and the program verify process is repeated for that next selected target threshold voltage level ($V_{TTH}$). If at block 630 the memory controller 102 determines that a program verify should not be performed on another threshold voltage level ($V_{TH}$), control advances to block 632 at which the target level selector 508 determines whether one or more higher threshold voltage level(s) ($V_{TH}$) have been skipped. For example, the target level selector 508 may determine that one or more threshold voltage level(s) ($V_{TH}$) higher on the threshold voltage distribution 202 (FIG. 2) than a currently selected target threshold voltage level ($V_{TTH}$) have been skipped as described above in connection with block 630. If the target level selector 508 determines at block 632 that one or more higher threshold voltage level(s) ($V_{TH}$) have been skipped, the buffer interface 506 updates the PPV target cell map 120 and the PV target cell map 122 with zeros '0' for target cells corresponding to the one or more skipped higher threshold voltage level(s) ($V_{TH}$).

After updating the PPV target cell map 120 and the PV target cell map 122 at block 634, or if the target level selector 508 determines at block 632 that one or more higher threshold voltage level(s) ($V_{TH}$) have not been skipped, the memory cell programmer 504 determines whether to perform a further memory cell programming pass (block 636). For example, the memory cell programmer 504 may analyze the PPV state in the PPV target cell map 120 and the PV state in the PV target cell map 122 for each analyzed target memory cell based on a logical truth table such as the program pulse-type table 404a-c shown in FIGS. 4A-4C to determine whether any of the analyzed target memory cells requires a full program pulse (PGM) 126 or a partial program pulse (SSPC) 128 to reach a corresponding target threshold voltage level ($V_{TTH}$). If the memory cell programmer 504 determines at block 636 that it should perform a further memory cell programming pass, the memory cell programmer 504 selectively applies one or more program pulse(s) to corresponding target cells based on the PPV target cell map 120 and the PV target cell map 122 (block 638). For example, the memory cell programmer 504 may determine that it should use the full program pulse (PGM) 126 (which has a relatively higher voltage than the partial program pulse (SSPC) 128) for target memory cells meeting the criteria of PPV state='0' and PV state='0' as shown in the program pulse-type table 404a of FIG. 4A. Additionally or alternatively, the memory cell programmer 504 may determine that it should use the partial program pulse (SSPC) 128 (which has a relatively lower voltage than the full program pulse (PGM) 126) for target memory cells meeting the criteria of PPV state='1' and PV state='0' as shown in the program pulse-type table 404b of FIG. 4B. In the illustrated example, after the memory cell programmer 504 performs the further memory cell programming pass, control returns to block 602 of FIG. 6A at which a target threshold voltage level ($V_{TTH}$) is selected and the program verify process is repeated for that selected target threshold voltage level ($V_{TTH}$).

Returning to block 636, if the memory cell programmer 504 determines that it should not perform a further memory cell programming pass based on the PPV states in the PPV target cell map 120 and based on the PV states in the PV target cell map 122, the example program verify process of FIGS. 6A and 6B ends. For example, the example program verify process of FIGS. 6A and 6B ends when the memory controller 102 verifies that the write data 220 of FIG. 2 is fully written as intended in the MLC flash memory 104.

FIG. 7 is a block diagram of an example processor platform 700 capable of executing the instructions of FIGS. 6A and 6B to implement the memory controller 102 of FIGS. 1, 2, and 5. The processor platform 700 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by one or more memory controllers. In the illustrated example of FIG. 7, the memory controller 102 and the MLC flash memory 104 are shown as being implemented in the non-volatile memory 716. In other examples, the memory controller 102 may be implemented separate from the non-volatile memory 716 and communicatively coupled with the non-volatile memory 716 to control the MLC flash memory 104.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device(s) 722 permit(s) a user to enter data and commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 720 of the illustrated example, thus, typically includes a graphics driver card, a graphics driver chip or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

Coded instructions 732 for use by the memory controller 102 to implement the program verify process of FIGS. 6A and 6B may be stored in the non-volatile memory 716, and/or on a removable tangible computer readable storage medium such as a CD or DVD.

Examples disclosed herein are useful to perform program verify operations on MLC flash memories to improve data integrity of information stored in such MLC flash memories. Examples disclosed herein are useful to conserve power during such program verify operations and to reduce adjacent bitline coupling noise between bitlines (BLs) by selectively activating only some of the bitlines (BLs) during program verify operations. Reducing power usage is useful for conserving battery power and extending battery life in battery-operated devices such as mobile telephones, tablet computers, laptop computers, portable media players, digital cameras, global positioning system (GPS) devices, and/or any other battery-operated device. In addition, reducing adjacent bitline coupling noise between neighboring bitlines (BLs) reduces the likelihood of electrical noise from unintentionally changing electrical characteristics of adjacent memory cells, thereby, improving data integrity of MLC flash memories.

Examples disclosed herein are also useful to substantially prevent or reduce SRC bounce voltage bias by selectively precharging bitlines corresponding to target memory cells without precharging bitlines corresponding to non-target memory cells. In this manner, by not precharging bitlines of non-target memory cells having a much lower target threshold voltage level ($V_{TH}$) than the gate-to-source voltages (Vgs), a SRC bounce voltage bias does not develop on a SRC plate of a memory die. As such, a page programming time (tPROG) of the memory does not need to be increased to accommodate a subsequent bitline precharge phase to remove the SRC bounce voltage bias from the SRC plate.

The following pertain to further examples disclosed herein.

Example 1 is a method to program a multi-level cell (MLC) memory. The method of Example 1 includes, during a program verify process: selectively precharging first bitlines of first MLC memory cells of a wordline without precharging second bitlines of second MLC memory cells of the wordline; obtaining first strobe state outputs of the first MLC memory cells, the first strobe state outputs based on first sensed threshold voltage levels of the first MLC memory cells sensed at a first time; and obtaining second strobe state outputs of the first MLC memory cells, the second strobe state outputs based on second sensed threshold voltage levels of the first MLC memory cells sensed at a second time. The method of Example 1 also includes, based on the first and second strobe state outputs, programming a first MLC memory cell of the first MLC memory cells using a first programming pulse, and programming a second MLC memory cell of the first MLC memory cells using a second programming pulse having a relatively higher voltage than the first programming pulse.

In Example 2, the subject matter of Example 1 can optionally include that the program verify process is to verify whether the first MLC memory cells satisfy a target threshold voltage level, and can further optionally include determining a target level encode word indicative of the first MLC memory cells of the wordline that are to be verified against the target threshold voltage level and indicative of the second MLC memory cells of the wordline that are not to be verified against the target threshold voltage level.

In Example 3, the subject matter of any one of Examples 1-2 can optionally include that the first bitlines are selectively precharged based on the target level encode word.

In Example 4, the subject matter of any one of Examples 1-3 can optionally include that the obtaining of the first and second strobe state outputs of the first MLC memory cells is based on using the target level encode word at sense amplifiers to mask outputs of the second MLC memory cells.

In Example 5, the subject matter of any one of Examples 1-4 can optionally include biasing a temporary cache capacitor of the first MLC memory cells before obtaining the first strobe state outputs of the first MLC memory cells, and unbiasing the temporary cache capacitor of the first MLC memory cells after obtaining the first strobe state outputs of the first MLC memory cells and before obtaining the second strobe state outputs of the first MLC memory cells.

In Example 6, the subject matter of any one of Examples 1-5 can optionally include selecting a target threshold voltage level from a plurality of threshold voltage levels representative of different multi-bit binary values, different ones of the first and second MLC memory cells being programmable to different ones of the plurality of threshold voltages to store corresponding ones of the multi-bit binary values.

In Example 7, the subject matter of any one of Examples 1-6 can optionally include that the first MLC memory cells are to be programmed to the target threshold voltage level, and the second MLC memory cells are not to be programmed to the target threshold voltage level.

In Example 8, the subject matter of any one of Examples 1-7 can optionally include that the first sensed threshold voltage levels correspond to amounts of electrical current that flow between drain terminals and source terminals of transistors corresponding to the first MLC memory cells.

In Example 9, the subject matter of any one of Examples 1-8 can optionally include determining to program the first MLC memory cell using the first programming pulse based on a corresponding one of the first strobe state outputs being representative of a corresponding one of the first sensed threshold voltage levels being greater than a trip voltage level of sense amplifiers during the first time, and based on a corresponding one of the second strobe state outputs being representative of a corresponding one of the second sensed threshold voltage levels being less than the trip voltage level of the sense amplifiers during the second time.

In Example 10, the subject matter of any one of Examples 1-9 can optionally include that the trip voltage level of the sense amplifiers is based on the target threshold voltage level.

In Example 11, the subject matter of any one of Examples 1-10 can optionally include storing the first strobe state outputs in a first target cell map, and storing the second strobe state outputs in a second target cell map.

Example 12 is an apparatus to program a multi-level cell (MLC) memory. The apparatus of Example 12 includes a voltage controller to selectively precharge first bitlines of first MLC memory cells of a wordline without precharging second bitlines of second MLC memory cells of the wordline during a program verify process. The apparatus of Example 12 also includes a buffer interface to: obtain first strobe state outputs of the first MLC memory cells, the first strobe state outputs based on first sensed threshold voltage levels of the first MLC memory cells sensed at a first time during the program verify process; and obtain second strobe state outputs of the first MLC memory cells, the second strobe state outputs based on second sensed threshold voltage levels of the first MLC memory cells sensed at a second time. The apparatus of Example 12 also includes a memory cell programmer to, based on the first and second strobe state outputs, program a first MLC memory cell of the first MLC memory cells using a first programming pulse, and program a second MLC memory cell of the first MLC memory cells using a second programming pulse having a relatively higher voltage than the first programming pulse.

In Example 13, the subject matter of Example 12 can optionally include a target level encode word generator to generate a target level encode word indicative of the first MLC memory cells of the wordline that are to be verified against a target threshold voltage level and indicative of the second MLC memory cells of the wordline that are not to be verified against the target threshold voltage level.

In Example 14, the subject matter of any one of Examples 12-13 can optionally include that the voltage controller to selectively precharge the first bitlines based on the target level encode word.

In Example 15, the subject matter of any one of Examples 12-14 can optionally include that the buffer interface is further to load the target level encode word into sense amplifiers of the MLC memory to mask outputs of the second MLC memory cells.

In Example 16, the subject matter of any one of Examples 12-15 can optionally include that the voltage controller is further to: bias a temporary cache capacitor of the first MLC memory cells before the buffer interface is to obtain the first strobe state outputs of the first MLC memory cells, and unbias the temporary cache capacitor of the first MLC memory cells after the buffer interface obtains the first strobe state outputs of the first MLC memory cells and before the buffer interface is to obtain the second strobe state outputs of the first MLC memory cells.

In Example 17, the subject matter of any one of Examples 12-16 can optionally include a target level selector to select a target threshold voltage level from a plurality of threshold voltage levels representative of different multi-bit binary values, different ones of the first and second MLC memory cells to be programmable to different ones of the plurality of threshold voltages to store corresponding ones of the multi-bit binary values.

In Example 18, the subject matter of any one of Examples 12-17 can optionally include that the first MLC memory cells are to be programmed to the target threshold voltage level, and the second MLC memory cells are not to be programmed to the target threshold voltage level.

In Example 19, the subject matter of any one of Examples 12-18 can optionally include that the first sensed threshold voltage levels correspond to amounts of electrical current that flow between drain terminals and source terminals of transistors corresponding to the first MLC memory cells.

In Example 20, the subject matter of any one of Examples 12-19 can optionally include that the memory cell programmer is further to determine to program the first MLC memory cell using the first programming pulse based on: a corresponding one of the first strobe state outputs being representative of a corresponding one of the first sensed threshold voltage levels being greater than a trip voltage level of sense amplifiers during the first time, and a corresponding one of the second strobe state outputs being representative of a corresponding one of the second sensed threshold voltage levels being less than the trip voltage level of the sense amplifiers during the second time.

In Example 21, the subject matter of any one of Examples 12-20 can optionally include that the trip voltage level of the sense amplifiers is based on the target threshold voltage level.

In Example 22, the subject matter of any one of Examples 12-21 can optionally include that the buffer interface is further to store the first strobe state outputs in a first target cell map, and store the second strobe state outputs in a second target cell map.

In Example 23, the subject matter of any one of Examples 12-22 can optionally include one or more processors, a network interface in communication with the one or more processors, and a memory controller in communication with the one or more processors, the memory controller including the voltage controller, the buffer interface, and the memory cell programmer.

Example 24 is at least one article of manufacture comprising machine readable instructions that, when executed, cause a memory controller to, during a program verify process: selectively precharge first bitlines of first multi-level cell (MLC) memory cells of a wordline without precharging second bitlines of second MLC memory cells of the wordline, obtain first strobe state outputs of the first MLC memory cells, the first strobe state outputs based on first sensed threshold voltage levels of the first MLC memory cells sensed at a first time; and obtain second strobe state outputs of the first MLC memory cells, the second strobe state outputs based on second sensed threshold voltage levels of the first MLC memory cells sensed at a second time. The instructions of Example 24 also cause the memory controller to based on the first and second strobe state outputs, program a first MLC memory cell of the first MLC memory cells using a first programming pulse, and program a second MLC memory cell of the first MLC memory cells using a second programming pulse having a relatively higher voltage than the first programming pulse.

In Example 25, the subject matter of Example 24 can optionally include that the program verify process is to verify whether the first MLC memory cells satisfy a target threshold voltage level, and can optionally include that the instructions are further to cause the memory controller to determine a target level encode word indicative of the first MLC memory cells of the wordline that are to be verified against the target threshold voltage level and indicative of the second MLC memory cells of the wordline that are not to be verified against the target threshold voltage level.

In Example 26, the subject matter of any one of Examples 24-25 can optionally include that the instructions are to cause the memory controller to selectively precharge the first bitlines based on the target level encode word.

In Example 27, the subject matter of any one of Examples 24-26 can optionally include that the instructions are further to cause the memory controller to load the target level encode word into sense amplifiers of the MLC memory to mask outputs of the second MLC memory cells.

In Example 28, the subject matter of any one of Examples 24-27 can optionally include that the instructions are further to cause the memory controller to: bias a temporary cache capacitor of the first MLC memory cells before obtaining the first strobe state outputs of the first MLC memory cells; and unbias the temporary cache capacitor of the first MLC memory cells after obtaining the first strobe state outputs of the first MLC memory cells and before obtaining the second strobe state outputs of the first MLC memory cells.

In Example 29, the subject matter of any one of Examples 24-28 can optionally include that the instructions are further to cause the memory controller to select a target threshold voltage level from a plurality of threshold voltage levels representative of different multi-bit binary values, different ones of the first and second MLC memory cells to be programmable to different ones of the plurality of threshold voltages to store corresponding ones of the multi-bit binary values.

In Example 30, the subject matter of any one of Examples 24-29 can optionally include that the first MLC memory cells are to be programmed to the target threshold voltage level, and the second MLC memory cells are not to be programmed to the target threshold voltage level.

In Example 31, the subject matter of any one of Examples 24-30 can optionally include that the first sensed threshold voltage levels correspond to amounts of electrical current that flow between drain terminals and source terminals of transistors corresponding to the first MLC memory cells.

In Example 32, the subject matter of any one of Examples 24-31 can optionally include that the instructions are further to cause the memory controller to determine to program the first MLC memory cell of the first MLC memory cells using the first programming pulse based on a corresponding one of the first strobe state outputs being representative of a corresponding one of the first sensed threshold voltage levels being greater than a trip voltage level of sense amplifiers during the first time, and based on a corresponding one of the second strobe state outputs being representative of a corresponding one of the second sensed threshold voltage levels being less than the trip voltage level of the sense amplifiers during the second time.

In Example 33, the subject matter of any one of Examples 24-32 can optionally include that the trip voltage level of the sense amplifiers is based on the target threshold voltage level.

In Example 34, the subject matter of any one of Examples 24-33 can optionally include that the instructions are to further cause the memory controller to store the first strobe state outputs in a first target cell map, and store the second strobe state outputs in a second target cell map.

Example 35 is an apparatus to program a multi-level cell (MLC) memory. The apparatus of Example 35 includes means for selectively precharging first bitlines of first MLC memory cells of a wordline without precharging second bitlines of second MLC memory cells of the wordline during a program verify process. The apparatus of Example 35 also includes means for: obtaining first strobe state outputs of the first MLC memory cells, the first strobe state outputs based on first sensed threshold voltage levels of the first MLC memory cells sensed at a first time during the program verify process; and obtaining second strobe state outputs of the first MLC memory cells, the second strobe state outputs based on second sensed threshold voltage levels of the first MLC memory cells sensed at a second time. The apparatus of Example 35 also includes means for, based on the first and second strobe state outputs, programming a first MLC memory cell of the first MLC memory cells using a first programming pulse, and programming a second MLC memory cell of the first MLC memory cells using a second programming pulse having a relatively higher voltage than the first programming pulse.

In Example 36, the subject matter of Example 35 can optionally include means for generating a target level encode word indicative of the first MLC memory cells of the wordline that are to be verified against a target threshold voltage level and indicative of the second MLC memory cells of the wordline that are not to be verified against the target threshold voltage level.

In Example 37, the subject matter of any one of Examples 35-36 can optionally include that the means for selectively precharging the first bitlines selectively precharges the first bitlines based on the target level encode word.

In Example 38, the subject matter of any one of Examples 35-37 can optionally include means for loading the target level encode word into sense amplifiers of the MLC memory to mask outputs of the second MLC memory cells.

In Example 39, the subject matter of any one of Examples 35-38 can optionally include means for: biasing a temporary cache capacitor of the first MLC memory cells before the buffer interface is to obtain the first strobe state outputs of the first MLC memory cells; and unbiasing the temporary cache capacitor of the first MLC memory cells after the buffer interface obtains the first strobe state outputs of the first MLC memory cells and before the buffer interface is to obtain the second strobe state outputs of the first MLC memory cells.

In Example 40, the subject matter of any one of Examples 35-39 can optionally include means for selecting a target threshold voltage level from a plurality of threshold voltage levels representative of different multi-bit binary values, different ones of the first and second MLC memory cells to be programmable to different ones of the plurality of threshold voltages to store corresponding ones of the multi-bit binary values.

In Example 41, the subject matter of any one of Examples 35-40 can optionally include that the first MLC memory cells are to be programmed to the target threshold voltage level, and the second MLC memory cells are not to be programmed to the target threshold voltage level.

In Example 42, the subject matter of any one of Examples 35-41 can optionally include that the first sensed threshold voltage levels correspond to amounts of electrical current that flow between drain terminals and source terminals of transistors corresponding to the first MLC memory cells.

In Example 43, the subject matter of any one of Examples 35-42 can optionally include that the means for programming is further to determine to program the first MLC memory cell using the first programming pulse based on: a corresponding one of the first strobe state outputs being representative of a corresponding one of the first sensed threshold voltage levels being greater than a trip voltage level of sense amplifiers during the first time, and a corresponding one of the second strobe state outputs being representative of a corresponding one of the second sensed threshold voltage levels being less than the trip voltage level of the sense amplifiers during the second time.

In Example 44, the subject matter of any one of Examples 35-43 can optionally include that the trip voltage level of the sense amplifiers is based on the target threshold voltage level.

In Example 45, the subject matter of any one of Examples 35-44 can optionally include that the means for obtaining the first and second strobe state outputs is further to store the first strobe state outputs in a first target cell map, and store the second strobe state outputs in a second target cell map.

In Example 46, the subject matter of any one of Examples 35-45 can optionally include one or more processors, a network interface in communication with the one or more processors, and a memory controller in communication with the one or more processors, the memory controller including the means for selectively precharging the first bitlines, the means for obtaining the first and second strobe state outputs, and the means for programming.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method to program a multi-level cell (MLC) memory, the method comprising:
    during a program verify process:
    selectively precharging first bitlines of first MLC memory cells of a wordline without precharging second bitlines of second MLC memory cells of the wordline;
    obtaining first strobe state outputs of the first MLC memory cells, the first strobe state outputs based on first sensed threshold voltage levels of the first MLC memory cells sensed at a first time; and
    obtaining second strobe state outputs of the first MLC memory cells, the second strobe state outputs based on second sensed threshold voltage levels of the first MLC memory cells sensed at a second time; and
    based on the first and second strobe state outputs, programming a first MLC memory cell of the first MLC memory cells using a first programming pulse, and programming a second MLC memory cell of the first MLC memory cells using a second programming pulse having a relatively higher voltage than the first programming pulse.

2. A method of claim 1, wherein the program verify process is to verify whether the first MLC memory cells satisfy a target threshold voltage level, and further including determining a target level encode word indicative of the first MLC memory cells of the wordline that are to be verified against the target threshold voltage level and indicative of the second MLC memory cells of the wordline that are not to be verified against the target threshold voltage level.

3. A method of claim 2, wherein the first bitlines are selectively precharged based on the target level encode word.

4. A method of claim 2, wherein the obtaining of the first and second strobe state outputs of the first MLC memory cells is based on using the target level encode word at sense amplifiers to mask outputs of the second MLC memory cells.

5. A method of claim 1, further including:
    biasing a temporary cache capacitor of the first MLC memory cells before obtaining the first strobe state outputs of the first MLC memory cells; and
    unbiasing the temporary cache capacitor of the first MLC memory cells after obtaining the first strobe state outputs of the first MLC memory cells and before obtaining the second strobe state outputs of the first MLC memory cells.

6. A method of claim 1, further including selecting a target threshold voltage level from a plurality of threshold voltage levels representative of different multi-bit binary values, different ones of the first and second MLC memory cells being programmable to different ones of the plurality of threshold voltages to store corresponding ones of the multi-bit binary values.

7. A method of claim 6, wherein the first MLC memory cells are to be programmed to the target threshold voltage level, and the second MLC memory cells are not to be programmed to the target threshold voltage level.

8. A method of claim 1, wherein the first sensed threshold voltage levels correspond to amounts of electrical current that flow between drain terminals and source terminals of transistors corresponding to the first MLC memory cells.

9. A method of claim 1, further including determining to program the first MLC memory cell using the first programming pulse based on a corresponding one of the first strobe state outputs being representative of a corresponding one of the first sensed threshold voltage levels being greater than a trip voltage level of sense amplifiers during the first time, and based on a corresponding one of the second strobe state outputs being representative of a corresponding one of the second sensed threshold voltage levels being less than the trip voltage level of the sense amplifiers during the second time.

10. A method of claim 1, further including storing the first strobe state outputs in a first target cell map, and storing the second strobe state outputs in a second target cell map.

11. An apparatus to program a multi-level cell (MLC) memory, the apparatus comprising:
  a voltage controller to selectively precharge first bitlines of first MLC memory cells of a wordline without precharging second bitlines of second MLC memory cells of the wordline during a program verify process;
  a buffer interface to:
    obtain first strobe state outputs of the first MLC memory cells, the first strobe state outputs based on first sensed threshold voltage levels of the first MLC memory cells sensed at a first time during the program verify process; and
    obtain second strobe state outputs of the first MLC memory cells, the second strobe state outputs based on second sensed threshold voltage levels of the first MLC memory cells sensed at a second time; and
  a memory cell programmer to, based on the first and second strobe state outputs, program a first MLC memory cell of the first MLC memory cells using a first programming pulse, and program a second MLC memory cell of the first MLC memory cells using a second programming pulse having a relatively higher voltage than the first programming pulse.

12. An apparatus of claim 11, further including a target level encode word generator to generate a target level encode word indicative of the first MLC memory cells of the wordline that are to be verified against a target threshold voltage level and indicative of the second MLC memory cells of the wordline that are not to be verified against the target threshold voltage level.

13. An apparatus of claim 12, wherein the voltage controller to selectively precharge the first bitlines based on the target level encode word.

14. An apparatus of claim 12, wherein the buffer interface is further to load the target level encode word into sense amplifiers of the MLC memory to mask outputs of the second MLC memory cells.

15. An apparatus of claim 11, wherein the voltage controller is further to:
  bias a temporary cache capacitor of the first MLC memory cells before the buffer interface is to obtain the first strobe state outputs of the first MLC memory cells; and
  unbias the temporary cache capacitor of the first MLC memory cells after the buffer interface obtains the first strobe state outputs of the first MLC memory cells and before the buffer interface is to obtain the second strobe state outputs of the first MLC memory cells.

16. An apparatus of claim 11, further including a target level selector to select a target threshold voltage level from a plurality of threshold voltage levels representative of different multi-bit binary values, different ones of the first and second MLC memory cells to be programmable to different ones of the plurality of threshold voltages to store corresponding ones of the multi-bit binary values, the first MLC memory cells to be programmed to the target threshold voltage level, and the second MLC memory cells not to be programmed to the target threshold voltage level.

17. An apparatus of claim 11, wherein the memory cell programmer is further to determine to program the first MLC memory cell using the first programming pulse based on:
  a corresponding one of the first strobe state outputs being representative of a corresponding one of the first sensed threshold voltage levels being greater than a trip voltage level of sense amplifiers during the first time, and
  a corresponding one of the second strobe state outputs being representative of a corresponding one of the second sensed threshold voltage levels being less than the trip voltage level of the sense amplifiers during the second time.

18. An apparatus of claim 11, wherein the buffer interface is further to store the first strobe state outputs in a first target cell map, and store the second strobe state outputs in a second target cell map.

19. An apparatus of claim 11, further including:
  one or more processors;
  a network interface in communication with the one or more processors; and
  a memory controller in communication with the one or more processors, the memory controller including the voltage controller, the buffer interface, and the memory cell programmer.

20. At least one article of manufacture comprising machine readable instructions that, when executed, cause a memory controller to at least:
  during a program verify process:
    selectively precharge first bitlines of first multi-level cell (MLC) memory cells of a wordline without precharging second bitlines of second MLC memory cells of the wordline;
    obtain first strobe state outputs of the first MLC memory cells, the first strobe state outputs based on first sensed threshold voltage levels of the first MLC memory cells sensed at a first time; and
    obtain second strobe state outputs of the first MLC memory cells, the second strobe state outputs based on second sensed threshold voltage levels of the first MLC memory cells sensed at a second time; and
  based on the first and second strobe state outputs, program a first MLC memory cell of the first MLC memory cells using a first programming pulse, and program a second MLC memory cell of the first MLC memory cells using a second programming pulse having a relatively higher voltage than the first programming pulse.

21. At least one article of manufacture of claim 20, wherein the program verify process is to verify whether the first MLC memory cells satisfy a target threshold voltage level, the instructions further to cause the memory controller to determine a target level encode word indicative of the first MLC memory cells of the wordline that are to be verified against the target threshold voltage level and indicative of the second MLC memory cells of the wordline that are not to be verified against the target threshold voltage level.

22. At least one article of manufacture of claim 21, wherein the instructions are to cause the memory controller to selectively precharge the first bitlines based on the target level encode word.

23. At least one article of manufacture of claim 21, wherein the instructions are further to cause the memory controller to load the target level encode word into sense amplifiers of the MLC memory to mask outputs of the second MLC memory cells.

24. At least one article of manufacture of claim 20, wherein the instructions are further to cause the memory controller to:
- bias a temporary cache capacitor of the first MLC memory cells before obtaining the first strobe state outputs of the first MLC memory cells; and
- unbias the temporary cache capacitor of the first MLC memory cells after obtaining the first strobe state outputs of the first MLC memory cells and before obtaining the second strobe state outputs of the first MLC memory cells.

25. At least one article of manufacture of claim 20, wherein the instructions are further to cause the memory controller to determine to program the first MLC memory cell of the first MLC memory cells using the first programming pulse based on a corresponding one of the first strobe state outputs being representative of a corresponding one of the first sensed threshold voltage levels being greater than a trip voltage level of sense amplifiers during the first time, and based on a corresponding one of the second strobe state outputs being representative of a corresponding one of the second sensed threshold voltage levels being less than the trip voltage level of the sense amplifiers during the second time.

* * * * *